(12) United States Patent
Wang et al.

(10) Patent No.: US 12,266,749 B2
(45) Date of Patent: Apr. 1, 2025

(54) DISPLAY SUBSTRATE HAVING CONDUCTIVE PARTS COMPRISE HOLLOWED-OUT PORTION

(71) Applicants: Hefei Xinsheng Optoelectronics Technology Co., Ltd., Anhui (CN); BOE Technology Group Co., Ltd., Beijing (CN)

(72) Inventors: Jie Wang, Beijing (CN); Zouming Xu, Beijing (CN); Xintao Wu, Beijing (CN); Jian Tian, Beijing (CN); Chunjian Liu, Beijing (CN); Jie Lei, Beijing (CN); Qin Zeng, Beijing (CN); Jianying Zhang, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/769,032

(22) PCT Filed: Apr. 30, 2021

(86) PCT No.: PCT/CN2021/091389
§ 371 (c)(1),
(2) Date: Apr. 14, 2022

(87) PCT Pub. No.: WO2022/226976
PCT Pub. Date: Nov. 3, 2022

(65) Prior Publication Data
US 2024/0105894 A1 Mar. 28, 2024

(51) Int. Cl.
*H01L 33/62* (2010.01)
*H01L 25/075* (2006.01)

(52) U.S. Cl.
CPC .......... *H01L 33/62* (2013.01); *H01L 25/0753* (2013.01)

(58) Field of Classification Search
CPC .............................. H01L 33/62; H01L 33/642
(Continued)

(56) References Cited

U.S. PATENT DOCUMENTS

2005/0077524 A1  4/2005  Ahn et al.
2006/0113538 A1  6/2006  Kim
(Continued)

FOREIGN PATENT DOCUMENTS

CN  107203060 A  9/2017
CN  108336109 A  7/2018
(Continued)

OTHER PUBLICATIONS

German Office Action, mailed Jan. 30, 2024, German Patent App. No. 11 2021 004 601.2.
(Continued)

*Primary Examiner* — Hoai V Pham
(74) *Attorney, Agent, or Firm* — Workman Nydegger

(57) ABSTRACT

A display substrate and a display apparatus are provided. The display substrate includes a base substrate, a first conductive layer, a second conductive layer and an insulation layer. The first conductive layer is on a side of the base substrate and includes a first conductive part extending in a first direction, the second conductive layer is on a side of the first conductive layer facing away from the base substrate, and the insulation layer is located between the first conductive layer and the second conductive layer. At least one first conductive part includes a first hollowed-out portion including a plurality of groove structures distributed in a second direction and extending in the first direction. The first direction and the second direction produce angles.

20 Claims, 17 Drawing Sheets

(58) Field of Classification Search
USPC .................................................. 257/59, 72
See application file for complete search history.

(56) References Cited

U.S. PATENT DOCUMENTS

| | | |
|---|---|---|
| 2018/0190742 A1 | 7/2018 | He et al. |
| 2018/0248139 A1 | 8/2018 | Zhai et al. |
| 2021/0376209 A1 | 12/2021 | Wang et al. |
| 2022/0181520 A1* | 6/2022 | Lee .................... H01L 33/382 |

FOREIGN PATENT DOCUMENTS

| | | |
|---|---|---|
| CN | 108549180 A | 9/2018 |
| CN | 110831353 A | 2/2020 |
| CN | 111146238 A | 5/2020 |
| CN | 111540764 A | 8/2020 |
| CN | 112242413 A | 1/2021 |
| WO | 2020077931 A1 | 4/2020 |

OTHER PUBLICATIONS

Chinese Office Action, mailed Aug. 10, 2024, from Chinese App. No. 202180000997.9, 13 pages.

* cited by examiner

DISPLAY SUBSTRATE HAVING CONDUCTIVE PARTS COMPRISE HOLLOWED-OUT PORTION

CROSS REFERENCE TO RELATED APPLICATIONS

The disclosure is a national phase entry under 35 U.S.C. § 371 of International Application No. PCT/CN2021/091389, filed on Apr. 30, 2021, the entire content of which is incorporated herein by reference.

FIELD

The present disclosure relates to the technical field of display, in particular to a display substrate and a display apparatus.

BACKGROUND

A mini-light-emitting diode (Mini-LED) is a new LED display technology derived from a small-spacing LED and is also called a submillimeter light-emitting diode. The Mini-LED has a good display effect, is light and thin and meanwhile has advantages of being high in contrast ratio, long in service life and the like, thereby being remarkable in application trend to the field of high-end display.

At present, a mainstream driving mode applied to the Mini-LED is active matrix (AM)-like driving using IC chips for LED groups as a control source, which can achieve elaborate partition adjustment and control. However, the wiring of a backplane of such driving mode is complicated, and a wire winding length is greatly increased. Further, in order to realize a lower voltage drop (IR Drop), a material (for example, Cu) with lower resistivity is adopted and the laying width of which is increased as much as possible in a manufacturing process, thus a problem of lower adhesion of a metal layer to an insulation layer OC material during manufacturing is caused, and consequently, a defect of a large number of separations of a product is caused.

SUMMARY

The present disclosure provides a display substrate and a display apparatus.

According to a first aspect of the present disclosure, a display substrate is provided and includes:
  a base substrate;
  a first conductive layer, disposed on a side of the base substrate and comprising a first conductive part extending in a first direction;
  a second conductive layer, disposed on a side of the first conductive layer facing away from the base substrate; and
  an insulation layer, disposed between the first conductive layer and the second conductive layer; wherein
  at least one first conductive part comprises a first hollowed-out portion, the first hollowed-out portion comprises a plurality of groove structures distributed in a second direction and extending in the first direction, and the first direction and the second direction produce angles.

In an exemplary implementation of the present disclosure, the first conductive layer comprises a plurality of first conductive parts having different sizes in the second direction, a size of the first hollowed-out portion in the second direction is in positive correlation with a size, in the second direction, of the first conductive part to which the first hollowed-out portion belongs, and a quantity of the groove structures in the first hollowed-out portion is in positive correlation with the size, in the second direction, of the first conductive part to which the first hollowed-out portion belongs.

In an exemplary implementation of the present disclosure, a ratio of the size of the first hollowed-out portion in the second direction to the size, in the second direction, of the first conductive part to which the first hollowed-out portion belongs is 20%-40%, and the size of the first hollowed-out portion in the second direction is a sum of sizes of all the groove structures in the first hollowed-out portion in the second direction.

In an exemplary implementation of the present disclosure, a ratio of a size of each of the groove structures in the first hollowed-out portion in the first direction to a size of the first conductive part in the first direction is 0.3%-0.5%.

In an exemplary implementation of the present disclosure, the groove structures in the first hollowed-out portion are distributed in the second direction in an equal-spacing mode.

In an exemplary implementation of the present disclosure, a size of the first hollowed-out portion in the first direction is in positive correlation with a size, in the first direction, of the first conductive part to which the first hollowed-out portion belongs, and a quantity of first hollowed-out portions is in negative correlation with the size, in the first direction, of the first conductive part to which the first hollowed-out portion belongs.

In an exemplary implementation of the present disclosure, the first hollowed-out portions are distributed in the first direction in an equal-spacing mode.

In an exemplary implementation of the present disclosure, the first conductive layer comprises a plurality of first conductive parts having different sizes in the second direction; and a space between two adjacent groove structures in the second direction is in positive correlation with a size, in the second direction, of the first conductive part to which the two adjacent groove structures belong.

In an exemplary implementation of the present disclosure, a ratio of the space between the two adjacent groove structures in the second direction to the size, in the second direction, of the first conductive part to which the two adjacent groove structures belong is 8%-10%.

In an exemplary implementation of the present disclosure, the second conductive layer comprises a second conductive part; and the at least one first conductive part further comprises a second hollowed-out portion, and an orthographic projection of at least a part of the second conductive part on the base substrate is located in a region defined by an orthographic projection of the second hollowed-out portion on the base substrate.

In an exemplary implementation of the present disclosure, an edge of the orthographic projection of the part of the second conductive part corresponding to the second hollowed-out portion is spaced from an edge of the orthographic projection of the second hollowed-out portion on the base substrate.

In an exemplary implementation of the present disclosure, the second conductive part comprises at least one of a bonding pad, a first lead, a second lead or a function unit.

In an exemplary implementation of the present disclosure, the second conductive part comprises a plurality of groups of bonding pads, and each group of bonding pads comprises a plurality of secondary bonding pads; and orthographic projections of at least a part of secondary bonding pads on the base substrate are respectively located in regions defined by orthographic projections of second hollowed-out portions in one-to-one correspondence with the at least part of secondary bonding pads, and a periphery of an orthographic projection of each of the secondary bonding pads is spaced from an edge of an orthographic projection of a second hollowed-out portion corresponding to the each of the secondary bonding pads.

In an exemplary implementation of the present disclosure, in the first direction, a space between two adjacent first hollowed-out portions is equal to a space between two adjacent groups of bonding pads.

In an exemplary implementation of the present disclosure, the first conductive part comprises at least two first hollowed-out portions distributed in the first direction in sequence, and a ratio of a space between the at least two first hollowed-out portions in the first direction to a space between the two adjacent groups of bonding pads is 0.8-2.

In an exemplary implementation of the present disclosure, the second conductive part comprises the first lead extending in the first direction; and an orthographic projection of at least a part of the first lead on the base substrate overlaps with the region defined by the orthographic projection of the second hollowed-out portion on the base substrate, and an edge of an orthographic projection of at least one side of the first lead is spaced from an edge of the orthographic projection of the second hollowed-out portion.

In an exemplary implementation of the present disclosure, the second conductive part comprises the second lead extending in the second direction; and an orthographic projection of at least a part of the second lead on the base substrate overlaps with the region defined by the orthographic projection of the second hollowed-out portion on the base substrate, and an edge of an orthographic projection of at least one side of the second lead is spaced from an edge of the orthographic projection of the second hollowed-out portion.

In an exemplary implementation of the present disclosure, the second conductive part comprises a plurality of function units; and an orthographic projection of each function unit on the base substrate is located in a region defined by an orthographic projection of each second hollowed-out portion corresponding to he each functioning unit, and a periphery of the orthographic projection of each function unit is spaced from an edge of the orthographic projection of each corresponding second hollowed-out portion.

In an exemplary implementation of the present disclosure, the second conductive part comprises a plurality of groups of bonding pads and first leads which are in one-to-one correspondence with the plurality of groups of bonding pads, and a distribution direction of the plurality of groups of bonding pads, an extending direction of the first leads and an extending direction of the second hollowed-out portion are the first direction; and orthographic projections of the first leads on the base substrate are located in a region of an orthographic projection of the second hollowed-out portion on the base substrate.

In an exemplary implementation of the present disclosure, orthographic projections of the plurality of groups of bonding pads on the base substrate are located in the region of the orthographic projection of the second hollowed-out portion on the base substrate.

In an exemplary implementation of the present disclosure, the function unit comprises a test conductive part electrically connected to the bonding pads, the first leads or the second leads, and the test conductive part is configured to detect electrical properties of the bonding pads, the first leads or the second leads.

In an exemplary implementation of the present disclosure, the display substrate further includes a buffer layer, disposed between the base substrate and the first conductive layer. The insulation layer fills the first hollowed-out portion and is in contact with the buffer layer via the first hollowed-out portion.

According to another aspect of the present disclosure, a display apparatus is provided and includes the display substrate described above.

It should be understood that the above general description and the following detailed description are only exemplary and explanatory instead of limiting the present disclosure.

BRIEF DESCRIPTION OF THE DRAWINGS

In order to describe technical solutions in embodiments of the present disclosure more clearly, the accompanying drawings needed in description of the embodiments are briefly introduced below. Obviously, the drawings in the following description are only some embodiments of the present disclosure. Those ordinarily skilled in the art can obtain other drawings according to these drawings without creative work.

Figure 1:
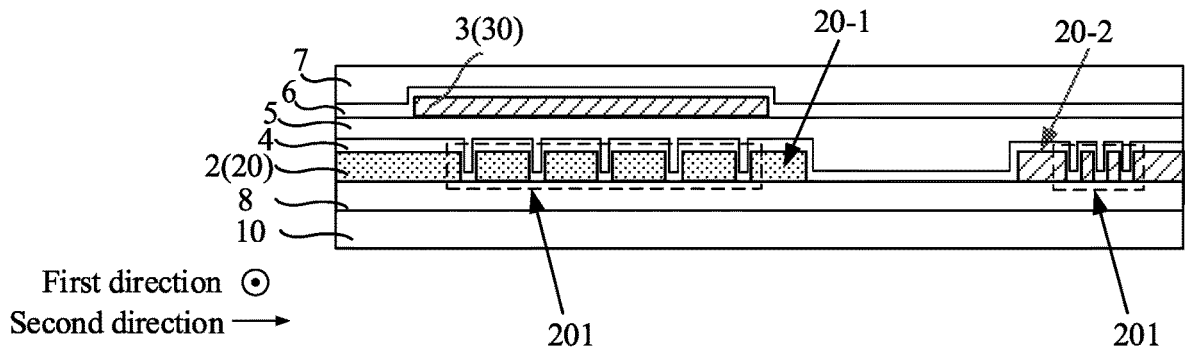
FIG. 1 is a schematic structural sectional view of a display substrate provided by an embodiment of the present disclosure.

In the drawings:
- 10, base substrate; 2, first conductive layer; 20; first conductive part; 201, first hollowed-out portion; 2010, first groove structure; 2011, second groove structure; 202, second hollowed-out portion; 2021, third groove structure; 3, second conductive layer; 30, second conductive part; 301, 3011 and 3012, bonding pad; 302, first lead; 303, second lead; 304, test conductive part; 4, first insulation layer; 5, second insulation layer; 6, third insulation layer; 7, fourth insulation layer; 8, buffer layer; EU, light-emitting unit; and L, light-emitting device.

DETAILED DESCRIPTION

Exemplary implementations will be described more comprehensively now with reference to the drawings. Nevertheless, the exemplary implementations can be implemented in various modes and should not be constructed as being limited to the implementations set forth herein. Rather, these implementations are provided to make the present disclosure complete and comprehensive and to comprehensively convey a concept of the exemplary implementations to those skilled in the art. The same reference numbers in the drawings represent the same or similar structure, and those detailed description will, therefore, be omitted. Besides, the drawings are only exemplary illustrations of the present disclosure and are not necessarily drawn in proportion.

Exemplary implementations will be described more comprehensively now with reference to the drawings. Nevertheless, the exemplary implementations can be implemented in various modes and should not be constructed as being limited to the implementations set forth herein. Rather, these implementations are provided to make the present disclosure complete and comprehensive and to comprehensively convey a concept of the exemplary implementations to those skilled in the art. The same reference numbers in the drawings represent the same or similar structure, and those detailed description will, therefore, be omitted.

In the drawings, for the sake of being clear, a thickness of a region and a layer may be exaggerated. The same reference numbers in the drawings represent the same or similar structure, those detailed description will, therefore, be omitted.

The described features, structures or properties may be incorporated into one or more embodiments in any suitable mode. Many specific details are provided in the following description so as to make the embodiments of the present disclosure be fully understood. Nevertheless, those skilled in the art will realize that the technical solutions of the present disclosure can be practiced without one or more particular details, or other methods, components, materials and the like may be adopted. In other cases, a known structure, material or operation is not shown or described in detail so as not to make main technical creativity of the present disclosure obscure.

When a certain structure is "on" another structure, it may mean that the certain structure is formed on the another structure in an integrated mode, or the certain structure is "directly" disposed on the another structure, or the certain structure is "indirectly" disposed on the another structure through yet another structure.

Words "a/an", "one" and "the" are intended to represent that there is one or more elements/components and the like; and words "include" and "have/has" are intended to represent open inclusion and mean that there may be other elements/components and the like besides the listed elements/components and the like. A word "first" or "second" is only used as a mark instead of limiting the quantity of its objects.

As shown in FIG. 1, a display substrate provided by an embodiment of the present disclosure includes a base substrate 10, a first conductive layer 2, a second conductive layer 3, a first insulation layer 4, a second insulation layer 5, a third insulation layer 6 and a fourth insulation layer 7. It can be seen from FIG. 1 that the first conductive layer 2 is disposed at a side of the base substrate 10 and includes a first conductive part 20 extending in a first direction, at least one first conductive part 20 includes a first hollowed-out portion 201, the first hollowed-out portion 201 may include a plurality of groove structures distributed in a second direction, the groove structures extend in the first direction, and the first direction and the second direction produce angles. The second conductive layer 3 is disposed at a side of the first conductive layer 2 facing away from the base substrate 10 and includes a second conductive part 30. The first insulation layer 4 and the second insulation layer 5 are disposed between the first conductive layer 2 and the second conductive layer 3, the third insulation layer 6 and the fourth insulation layer 7 are disposed on the second conductive layer 3, and a buffer layer 8 may be disposed between the base substrate 10 and the first conductive layer 2. In some embodiments, the first insulation layer 4 and the third insulation layer 6 may be an inorganic insulation material, for example, at least one of silicon oxide, silicon nitride or silicon oxynitride; and the second insulation layer 5 and the fourth insulation layer 7 may be an organic insulation material, for example, organic resin. It can be understood that selection of specific materials of the first insulation layer 4, the second insulation layer 5, the third insulation layer 6 and the fourth insulation layer 7 is not limited to this. It can be understood that a depth of each of the groove structures in the direction perpendicular to a plane where the base substrate 10 is located is basically equal to a thickness of the first conductive layer 2 or the first conductive part 20 perpendicular to the plane where the base substrate 10 is located, that is, the groove structure is a hollowed-out slot running through the first conductive part 20.

In FIG. 1, the first direction is a direction perpendicular to a paper surface, and the second direction is a horizontal direction parallel to the paper surface, that is, the included angle between the first direction and the second direction is 90°, and the first direction is perpendicular to the second direction. Of course, the above description is only an example, and the included angle between the first direction and the second direction is not limited to 90°, which is not specifically limited by the embodiment of the present disclosure.

In the embodiment of the present disclosure, the first conductive layer includes the first conductive part extending in the first direction, the at least one first conductive part includes the first hollowed-out portion, the first hollowed-out portion includes the plurality of groove structures distributed in the second direction, and the groove structures extend in the first direction, so an occupying area of the first conductive part to the base substrate as well as the first conductive part to the insulation layer may be reduced through the groove structures, adhesion between the first conductive part and the base substrate as well as between the first conductive part and the insulation layer is enhanced, and a reject ratio of a product can be reduced.

The first conductive layer 2 is usually configured to arrange various signal lines, that is, the first conductive part 20 may be various signal lines, for example, a common voltage line GND, a driving voltage line VLED, a source power line PWR, a source address line DI and the like. Optionally, a thickness of the first conductive layer 2 is about 1.5-7 μm, and its material may include copper, for example, a sandwich structure such as MoNb/Cu/MoNb may be formed by sputtering. A material at a side of the sandwich structure close to a base is MoNb, whose thickness is about 300 Å and which is mainly used for improving adhesion of a film layer and the base; a material of a middle layer of the sandwich structure is Cu which is a preferred material of an electrical signal transmission channel; and a material at a side of the sandwich structure away from the base is MoNb, whose thickness is about 200 Å and which can be used for protecting the middle layer and preventing a surface of the middle layer with low resistivity from exposure and oxidation. The first conductive layer may be formed by electroplating, specifically, a seed layer may be formed by using MoNiTi firstly so as to improve nucleation density of metal grains in a subsequent electroplating, then copper with low resistivity is manufactured through electroplating, and then an anti-oxidation layer can be manufactured, whose material may be MoNiTi.

The second conductive layer 3 is usually configured to arrange bonding pads and leads for connection. Optionally, a thickness of a film layer of the second conductive layer is about 6000 Å.

As shown in FIG. 1, the second conductive layer 3 in the embodiment of the present disclosure may include a second conductive part(s) 30, and the second conductive part 30 may be the bonding pad 301 used for bonding various electrical elements, for example, a bonding pad 3011 used for installing a light-emitting element, and/or a bonding pad 3012 used for installing a function element such as a driving chip or a sensor; and the second conductive part includes leads for connection, that is, the second conductive part 30 may also include a first lead 302 extending in the first direction and a second lead 303 extending in the second direction. The bonding pad 301 is a part in the second conductive part 30 to be electrically connected to an electronic element (for example, a light-emitting device, a driving circuit, a sensor and other elements), and a surface of the part away from the base substrate needs to be partially exposed before connection with the electronic element. The surface of the part away from the base substrate is covered with an insulation material layer so as to guarantee reliability and stability of an electrical channel. In order to prevent a problem that the bonding pad 301 may be oxidated due to exposure in air in a process from manufacturing procedure of a substrate to a manufacturing procedure of arranging the electronic element on the substrate, an anti-oxidation material layer may be provided only on an exposed surface region of the bonding pad 301, that is, a surface of a bonding pad region may have one more layer of structure than a region where the first lead 302 and the second lead 303 are located. Or, the whole second conductive part 30 is arranged to be of a lamination structure having at least two layers, whose film layer material away from the base substrate 10 is an anti-oxidation metal or alloy material, specifically, may be composed of a lamination structure of for example, MoNb/Cu/CuNi, a material MoNb of a bottom layer in the lamination is mainly used for improving adhesion, the middle layer Cu in the lamination is mainly used for transmitting an electrical signal due to its low resistivity, and a top layer CuNi in the lamination can not only prevent the middle layer from oxidation, but also guarantee firmness of connection to the electronic element.

In an embodiment, the first conductive layer 2 may include a plurality of first conductive parts 20 having different sizes in the second direction, a size of the first hollowed-out portion 201 in the second direction is in positive correlation with a size, in the second direction, of the first conductive part 20 corresponding thereto, and the quantity of the groove structures in the first conductive part 20 is in positive correlation with the size, in the second direction, of the first conductive part 20 corresponding thereto.

Figure 2:
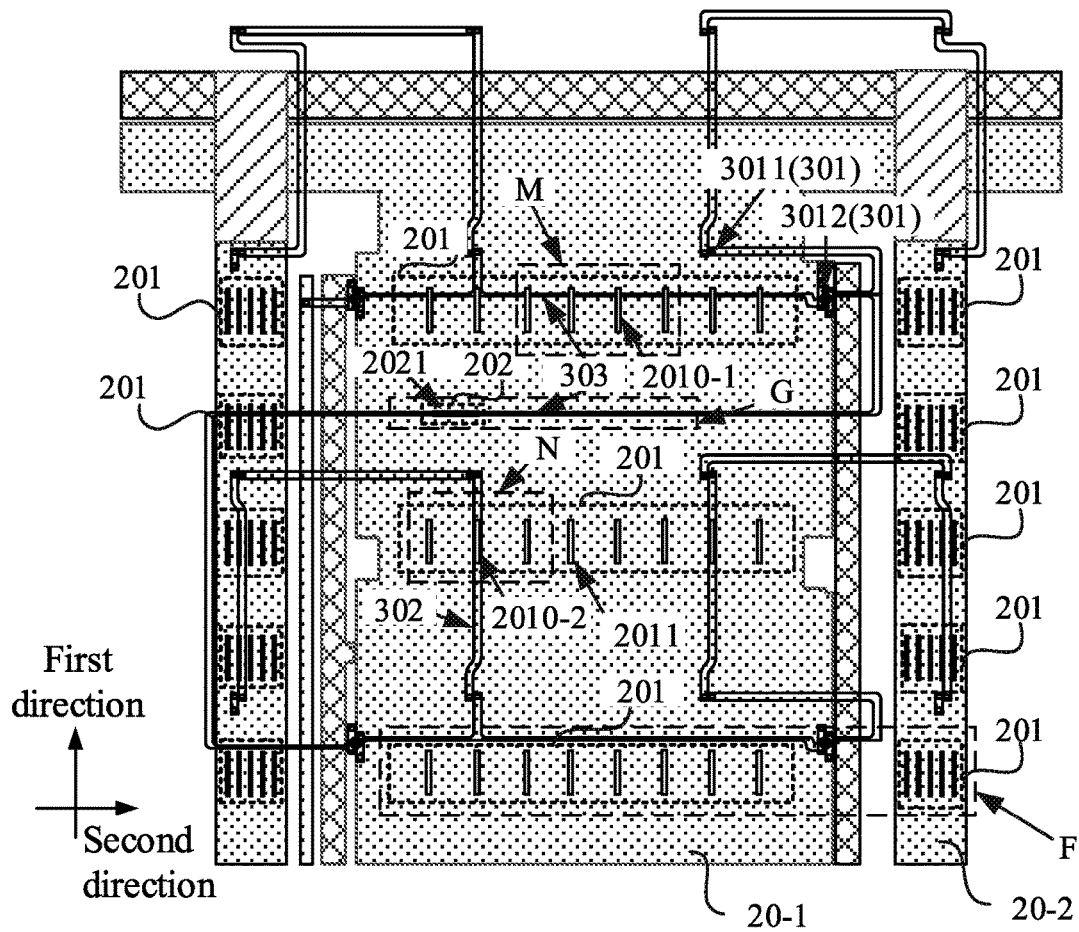
FIG. 2 is a schematic structural diagram of a display substrate provided by an embodiment of the present disclosure.

As shown in FIG. 2, the first conductive layer 2 includes the first conductive parts having different width sizes in the second direction, for example, 20-1 and 20-2, and a size of the first conductive part 20-1 in the second direction is larger than a size of the first conductive part 20-2 in the second direction. It can be seen from FIG. 1 that a size, in the second direction, of the first hollowed-out portion 201 corresponding to the first conductive part 20-1 is larger than a size, in the second direction, of the first hollowed-out portion 201 corresponding to the first conductive part 20-2, and the quantity of the groove structures in the first hollowed-out portion 201 corresponding to the first conductive part 20-1 is larger than the quantity of the groove structures in the first hollowed-out portion 201 corresponding to the first conductive part 20-2.

It needs to be noted that the size of the first hollowed-out portion 201 in the second direction is a sum of sizes of all the groove structures in the first hollowed-out portion 201 in the second direction.

In specific design, a ratio of the size of the first hollowed-out portion 201 in the second direction to the size, in the second direction, of the first conductive part 20 corresponding thereto may be set to be 20%-40% according to actual demands.

In the embodiment of the present disclosure, the size of the first hollowed-out portion 201 in the second direction is the sum of the sizes of all the groove structures in the first hollowed-out portion in the second direction.

It needs to be noted that the sizes in the drawings of the embodiment of the present disclosure are only illustrative and do not represent actual sizes.

A size of each of the groove structures in the first hollowed-out portion 201 in the first direction is in positive correlation with a size, in the first direction, of the first conductive part corresponding thereto. Specifically, a ratio of a size of each of the groove structures in the first hollowed-out portion 201 in the first direction to a size of the first conductive part 20 in the first direction may be set to be 0.3%-0.5% according to actual demands.

The size of the first hollowed-out portion is set to be in positive correlation with the size of the first conductive part, so the first hollowed-out portions of different sizes may be arranged according to the first conductive parts of different sizes, thus adhesion of the first conductive part and the base substrate may be better enhanced, and adhesion of the first conductive part and the insulation layer may be better enhanced.

In an embodiment, the groove structures in the first hollowed-out portion 201 in the second direction may be in an equal-spacing distribution.

In an embodiment, in the case that the first conductive part includes a plurality of first hollowed-out portions, the first hollowed-out portions 201 may be distributed in the first direction in an equal-spacing mode.

The groove structures in the first hollowed-out portions are distributed in an equal-spacing mode, and/or the plurality of first hollowed-out portions in the first conductive part are distributed in an equal-spacing mode, so that adhesion of all the positions of the first conductive part is uniform, and a yield of a product is improved.

In an embodiment, a size of the first hollowed-out portion 201 in the first direction is in positive correlation with the size, in the first direction, of the first conductive part 20 corresponding thereto, and the quantity of first hollowed-out portions 201 is in negative correlation with the size, in the first direction, of the first conductive part 20 corresponding thereto.

The smaller the size of the first conductive part in the first direction is, the lower the adhesion between the first conductive part and a film layer will be, so the quantity of first hollowed-out portions may be set to be in negative correlation with the size, in the first direction, of the first conductive part to which the first hollowed-out portion belongs.

The size of the first hollowed-out portion in the first direction is set to be in positive correlation with the size of the first conductive part in the first direction, and the quantity of the first hollowed-out portions is set to be in negative correlation with the size of the first conductive part kin the first direction, so that the adhesion of the first conductive part and the base substrate may be better enhanced, and the adhesion of the first conductive part and the insulation layer may be better enhanced.

As shown in FIG. 2, the first conductive layer includes the plurality of first conductive parts having different sizes in the second direction. In FIG. 2, the size of the first conductive part 20-1 in the second direction is larger than the size of the first conductive part 20-2 in the second direction, and the larger the size of the first conductive part in the second direction is, the larger a space between the groove structures in the first hollowed-out portion may be set to be, the larger a space between two adjacent first hollowed-out portions in the first direction may be also set to be.

In an embodiment, a space between adjacent first hollowed-out portions 201 in the first direction may be equal to a space between two adjacent groups of bonding pads in the first direction, and in another embodiment, a ratio of the space between adjacent first hollowed-out portions 201 in the first direction to the space between the two adjacent groups of bonding pads in the first direction is 0.8-2.

One group of bonding pads in the embodiment of the present disclosure refers to a plurality of bonding pads located in one light-emitting unit EU, which may specifically include a bonding pad for welding a light-emitting device and a bonding pad for welding a driving chip. The space between the two adjacent groups of bonding pads in the first direction refers to a distance between two bonding pads with the same relative position respectively located in two light-emitting units EU which are adjacent in the first direction.

Figure 3:
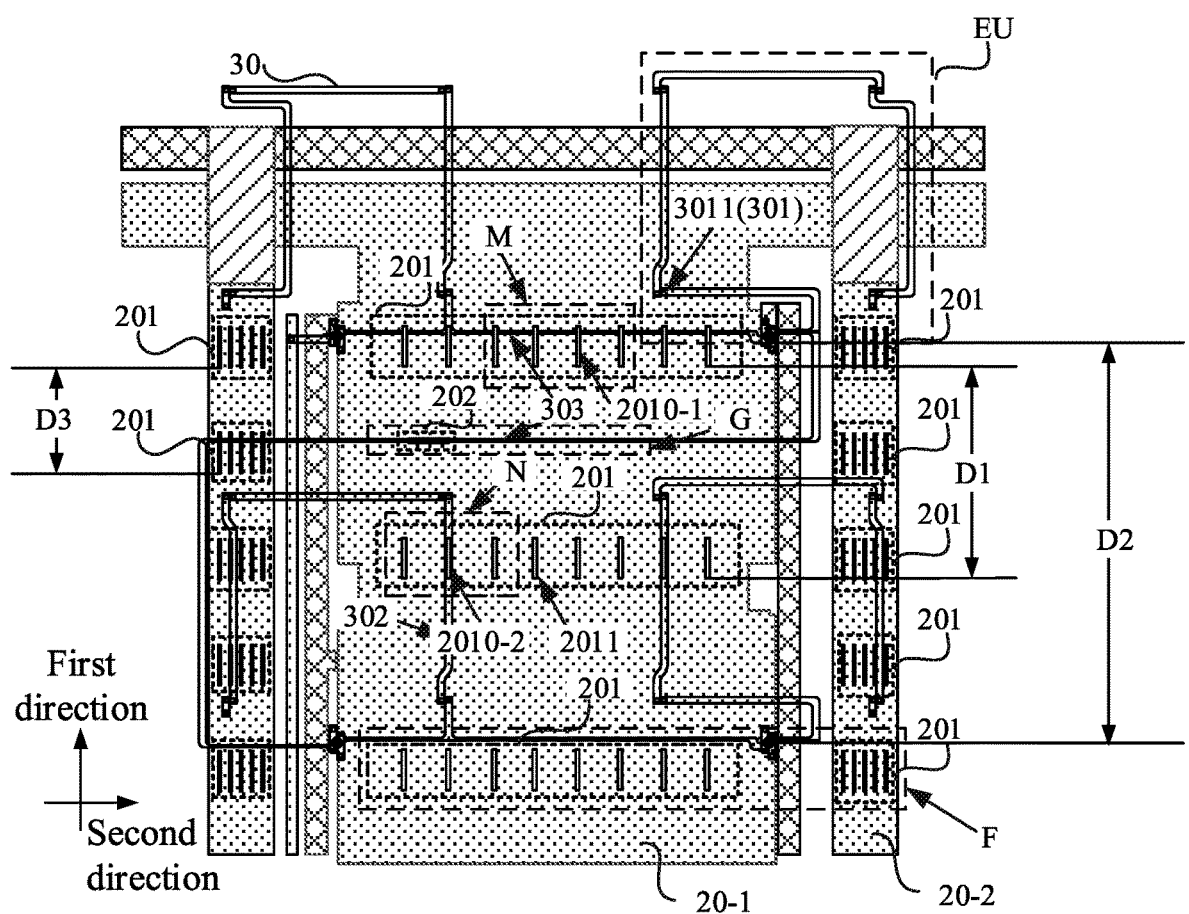
FIG. 3 is a schematic structural diagram of another display substrate provided by an embodiment of the present disclosure.

As shown in FIG. 3, one light-emitting unit 3011 includes four light-emitting devices L connected in series starting with the light-emitting device electrically connected to the driving voltage line VLED and ending in the light-emitting device electrically connected to the driving chip. The four light-emitting devices are driven by the driving chip.

It needs to be noted that in the embodiment of the present disclosure, the quantity of the light-emitting devices L in each light-emitting unit EU is not limited, which may be 5, 6, 7, 8 or any other quantity, which is not limited to 4. The light-emitting devices L in each light-emitting unit EU is not limited to be in series connection and may be in parallel connection or in combination of series connection and parallel connection. Besides, the light-emitting device L may be a Mini LED, MicroLED, OLED, QLED or any other type of light-emitting devices.

As shown in FIG. 3, D1 is a space between the first hollowed-out portions on the first conductive part 20-1 in the first direction, D3 is a space between the first hollowed-out portions on the first conductive part 20-2 in the first direction, and D2 is the space between the two adjacent groups of bonding pads in the first direction.

It needs to be noted that the space between the first hollowed-out portions in the first direction is the distance between the two groove structures with the same relative position in the two first hollowed-out portions in the first direction. The space between the two groups of bonding pads in the first direction is a distance between side edges, facing the same direction in the first direction, of the bonding pads for welding the driving chip among the two groups of bonding pads.

Due to limit of a substrate size, technologies and the like, during the manufacture of the second conductive part 30, the second conductive part usually inevitably overlaps with the first conductive part 20, an overlapping region thereof is a region with weak properties, in which a short circuit or an open circuit is prone to occurring, and consequently, defects may occur or reliability is affected.

For example, if an orthographic projection of the bonding pad on the base substrate overlaps with an orthographic projection of the signal line on the base substrate, when the electronic element is bonded to the bonding pad, for example, when an LED chip is welded by using a reflow soldering technology, a transient temperature of the reflow soldering technology reaches up to 260-265° C., which is prone to exceed the allowable value of the temperature resistance of the insulation layer between the bonding pad and the signal line, consequently, the insulation layer is easily broken, to cause a short circuit between the bonding pad and the signal line.

For another example, particles such as dust and foreign matter may be inevitably generated in a thin film manufacturing procedure, and when the particles exist in an overlapping region of the lead and the signal line, instable communication of the lead and the signal line is prone to occurring, and reliability of the product is affected. Furthermore, when a current or voltage test is performed on an upper-layer lead by using a probe pricking test, the signal line below is prone to being pricked by penetrating through the insulation layer, and consequently, test is inaccurate or accuracy is lowered.

A reason why the short circuit occurs to the first conductive part 20 and the second conductive part 30 is as follows. The first conductive part 20 is usually thicker and wider, so that the first conductive part 20 can have lower resistivity. When a larger voltage/current is provided, IR voltage drop can be reduced, a problem of RC delay is solved, and the lower resistivity is realized. The second conductive part 30 is usually narrower and shorter and exists as the lead, the bonding pad and the like. Therefore, a certain potential difference exists between the first conductive part 20 and the second conductive part 30. In a manufacturing procedure of a glass-based thin film, the insulation layer between the two conductive parts is in a semi-solid semi-liquid state before being cured, and water vapor introduced in the procedure may remain in the insulation layer. When a voltage difference exists in voltage signals between the first conductive part 20 and the second conductive part 30, an electrochemical reaction may occur to water under existence of the potential difference, $OH^-$ is formed in the insulation layer, and $OH^-$ may cause the short circuit between the first conductive part 20 and the second conductive part 30.

Obviously, in order to guarantee product quantity and properties, the short circuit between the first conductive part 20 and the second conductive part 30 should be avoided as much as possible.

In some embodiments, as for a small-size product, a wire width ratio of the first conductive part 20 to the second conductive part 30 is about 20 to 30; and as for a large-size product, the wire width ratio of the first conductive part 20 to the second conductive part 30 may be 100 or higher above, so the second conductive part 30 inevitably overlaps with the first conductive part 20.

In order to lower probability of the short circuit between the first conductive part 20 and the second conductive part 30, the first hollowed-out portion 201 may be arranged in an overlapping region of the first conductive part 20 and the second conductive part 30. As the first hollowed-out portion 201 includes the groove structures, and an overlapping area of the first conductive part 20 and the second conductive part 30 can be reduced due to existence of the groove structures, so that the probability of occurrence of the short circuit between the first conductive part 20 and the second conductive part 30 may be lowered.

Specifically, as shown in FIG. 2, the first hollowed-out portion 201 may include first groove structures 2010 (2010-1 and 2010-2) and a second groove structure 2011, orthographic projections of the first groove structures 2010 (2010-1 and 2010-2) on the base substrate 10 at least partially overlap with an orthographic projection of the second conductive part 30 (the second lead 303) on the base substrate 10, and an orthographic projection of the second groove structure 2011 on the base substrate 10 does not overlap with the orthographic projection of the second conductive part 30 on the base substrate 10.

The first groove structure 2010 is arranged in the first conductive part 20 and at least partially overlaps with the second conductive part 30, so the first groove structure 2010 can reduce an overlapping area of the first conductive part and the buffer layer and reduce an overlapping area of the first conductive part and the insulation layer, so that the adhesion of the first conductive part and the buffer layer is enhanced, the adhesion of the first conductive part and the insulation layer is enhanced. Meanwhile, the probability of occurrence of the short circuit between the first conductive part 20 and the second conductive part 30 can be reduced, and thus the reject ratio of the product can be reduced.

The orthographic projection of the first groove structure 2010 on the base substrate 10 may partially fall within a range of the orthographic projection of the second conductive part 30 on the base substrate 10, or may fully fall within the range of the orthographic projection of the second conductive part 30 on the base substrate 10. As shown in FIG. 2, the first groove structure 2010-1 partially falls within a range of an orthographic projection of the second lead 303 on the base substrate, and the first groove structure 2010-2 fully falls within a range of an orthographic projection of the first lead 302 on the base substrate.

In the embodiment of the present disclosure, if the second conductive part overlaps with the first conductive part, and the second conductive part is the second lead, then a size of the first groove structure in the first direction may be larger than a size of the second lead in the first direction, however, requiring that the first groove structure does not disconnect signal transmission of the first conductive part.

If the second conductive part does not overlap with the first conductive part, when a substrate size is 1850 mm*1500 mm, a size of the second groove structure in the first direction may be 300 µm-500 µm, and a size of the second groove structure in the second direction may be 100 µm-300 µm.

Detailed description is made below by taking an example.

Figure 4:
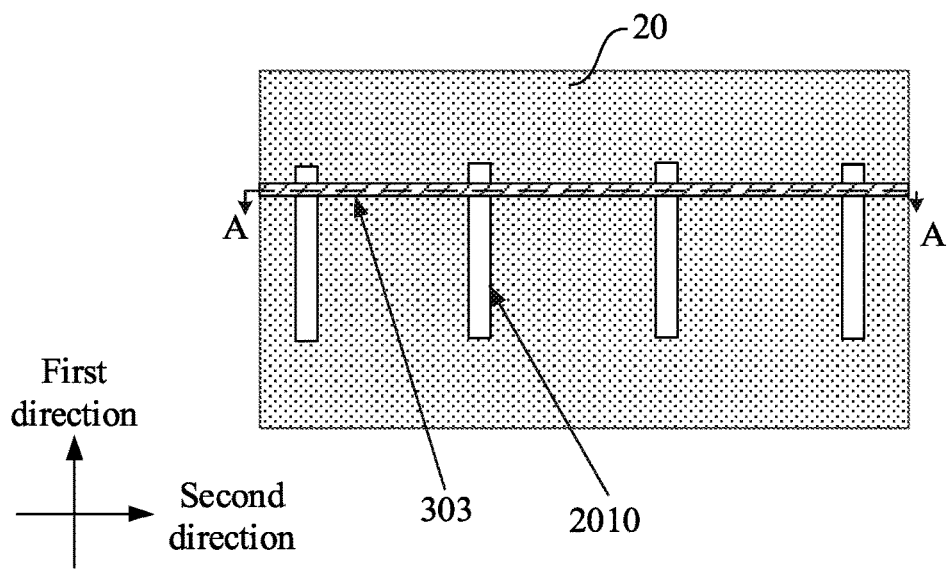
FIG. 4 is an enlarged view of a region M in FIG. 2 provided by an embodiment of the present disclosure.

FIG. 4 is an enlarged view of a region M in FIG. 2.

In FIG. 4, the orthographic projection of the first groove structure 2010 on the base substrate 10 partially falls within the range of the orthographic projection of the second lead 303 on the base substrate 10, and the size of the first groove structure 2010 in the first direction is larger than the size of the second lead 303 in the first direction.

Figure 5:
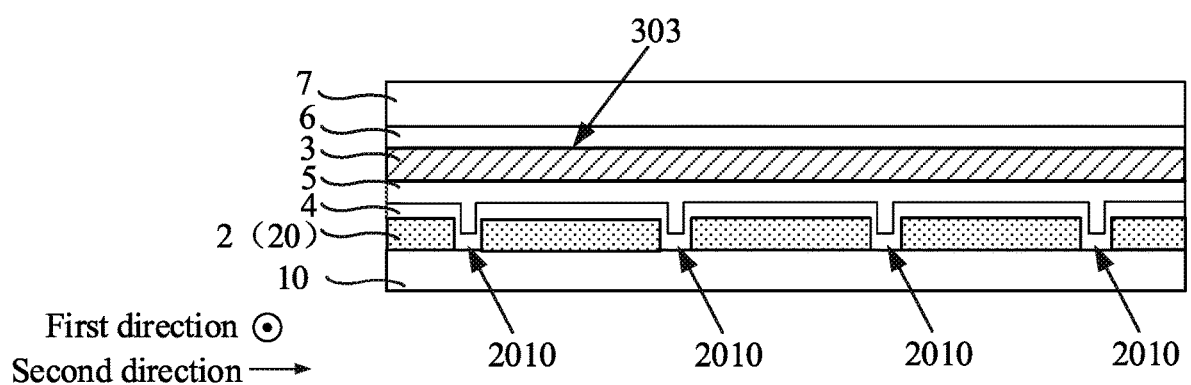
FIG. 5 is a schematic sectional view along a direction indicated by line A-A in FIG. 4 provided by an embodiment of the present disclosure.

FIG. 5 is a schematic sectional view along a direction indicated by line A-A in FIG. 4.

Figure 6:
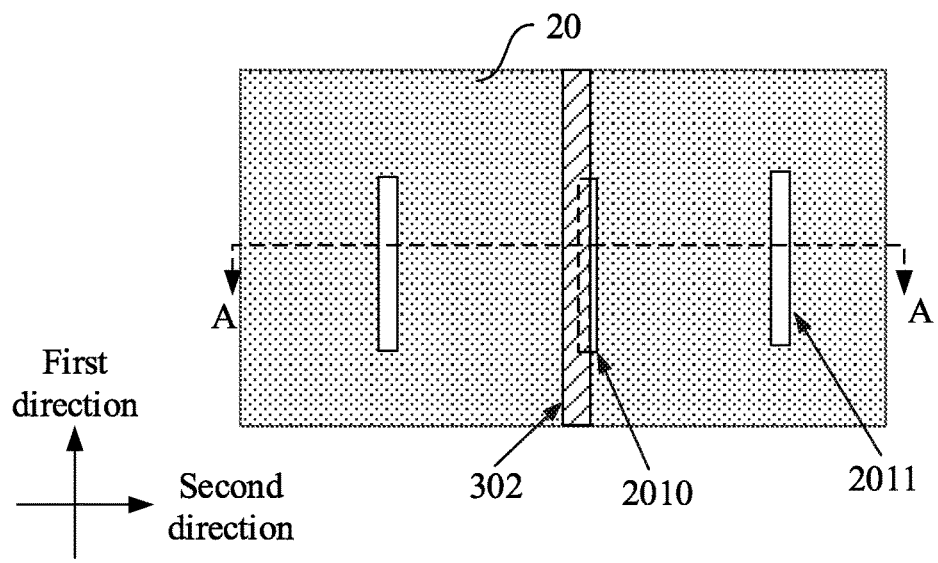
FIG. 6 is an enlarged view of a region N in FIG. 2 provided by an embodiment of the present disclosure.

FIG. 6 is an enlarged view of a region N in FIG. 2.

In FIG. 6, the orthographic projection of the first groove structure 2010 on the base substrate partially falls within the range of the orthographic projection of the first lead 302 on the base substrate 10, and a size of the first groove structure 2010 in the second direction is smaller than a size of the first lead 302 in the second direction.

It needs to be noted that part indicated by dotted line in FIG. 6 is a part of the first groove structure 2010 covered with the second lead 302.

Figure 7:
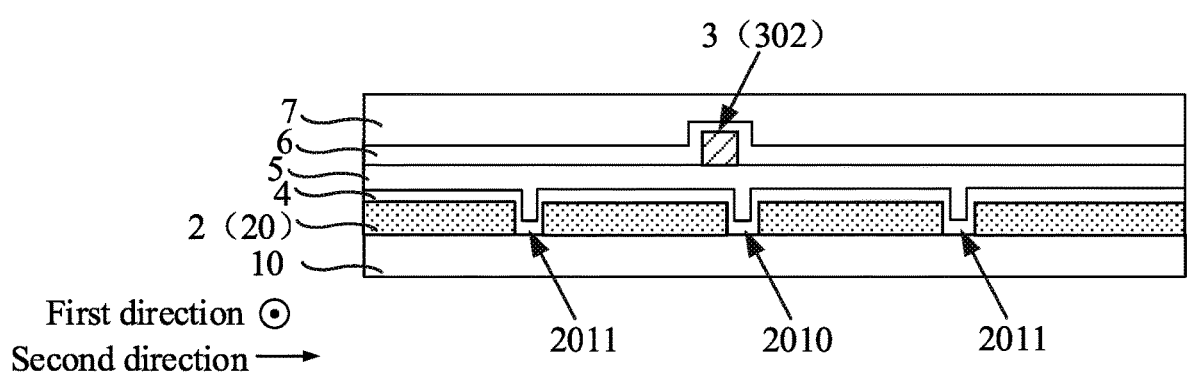
FIG. 7 is a schematic sectional view along a direction indicated by line A-A in FIG. 6 provided by an embodiment of the present disclosure.

FIG. 7 is a schematic sectional view along a direction indicated by line A-A in FIG. 6.

Figure 8:
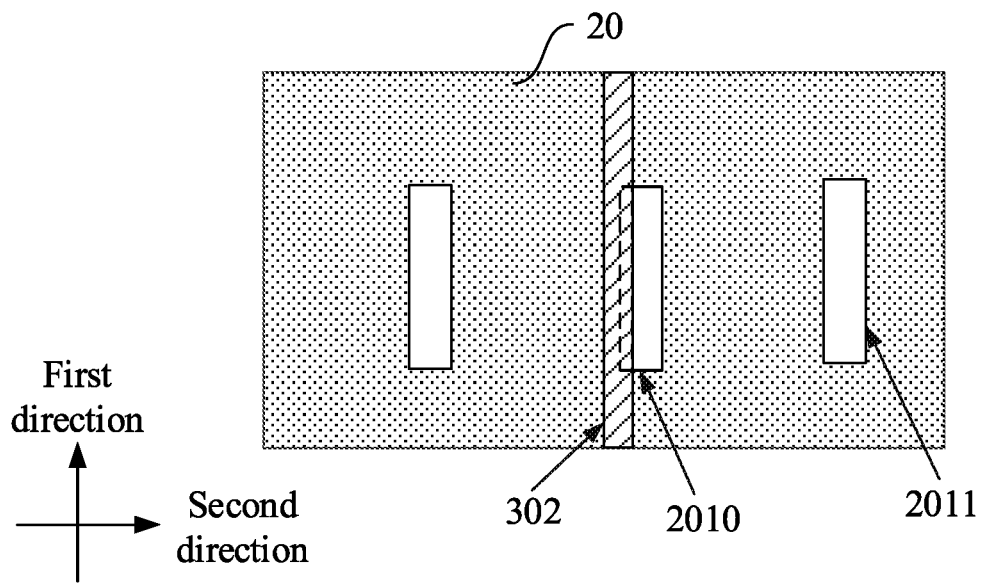
FIG. 8 is another enlarged view of region N in FIG. 2 provided by an embodiment of the present disclosure.

FIG. 8 is an enlarged view of a region N in FIG. 2.

In FIG. 8, the orthographic projection of the first groove structure 2010 on the base substrate partially falls within the range of the orthographic projection of the first lead 302 on the base substrate 10, and the size of the first groove structure in the second direction is larger than the size of the first lead 302 in the second direction.

It needs to be noted that a part indicated by the dotted line in FIG. 8 is a part of the first groove structure 2010 covered with the second lead 302.

Figure 9:
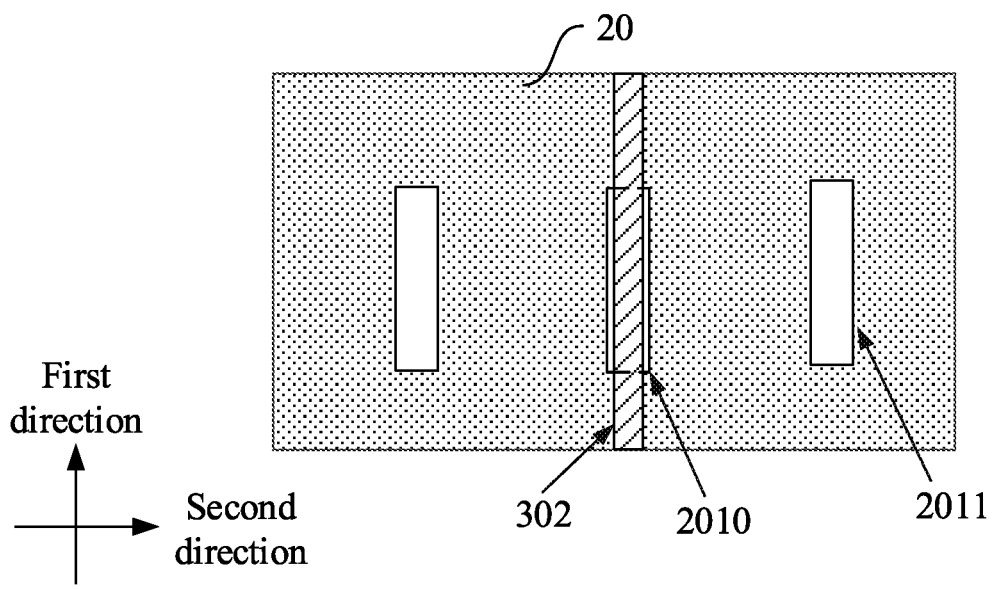
FIG. 9 is yet another enlarged view of region N in FIG. 2 provided by an embodiment of the present disclosure.

FIG. 9 is an enlarged view of a region J in FIG. 2.

In FIG. 9, the orthographic projection of the first groove structure 2010 on the base substrate partially falls within the range of the orthographic projection of the first lead 302 on the base substrate 10, and the size of the first groove structure 2010 in the second direction is larger than the size of the first lead 302 in the second direction.

It needs to be noted that a part indicated by the dotted line in FIG. 9 is a part of the first groove structure 2010 covered with the second lead 302.

Figure 10:
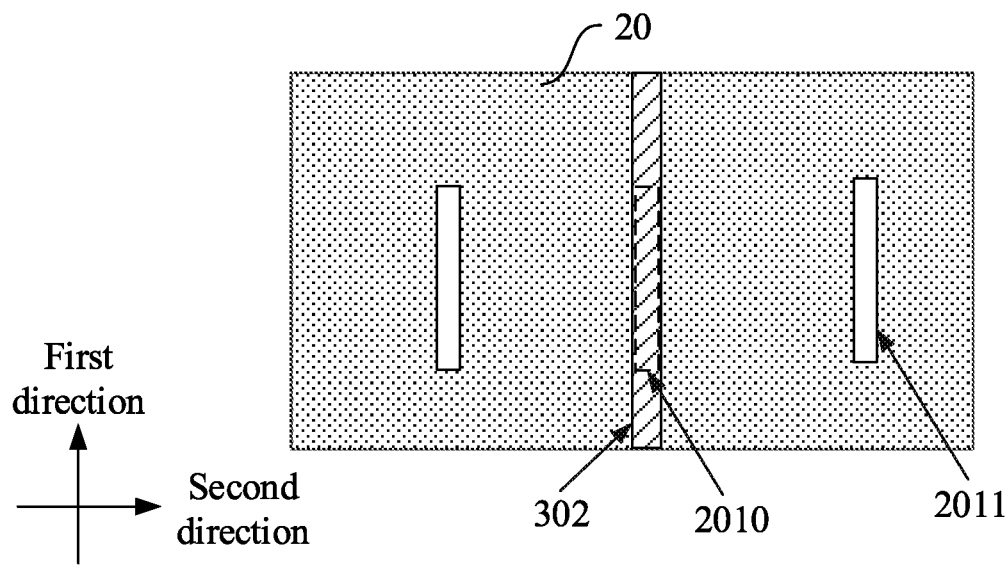
FIG. 10 is yet another enlarged view of region N in FIG. 2 provided by an embodiment of the present disclosure.

FIG. 10 is an enlarged view of a region N in FIG. 2.

In FIG. 10, the orthographic projection of the first groove structure 2010 on the base substrate fully falls within the range of the orthographic projection of the first lead 302 on the base substrate 10, and the size of the first groove structure 2010 in the second direction is smaller than the size of the first lead 302 in the second direction.

Figure 11:
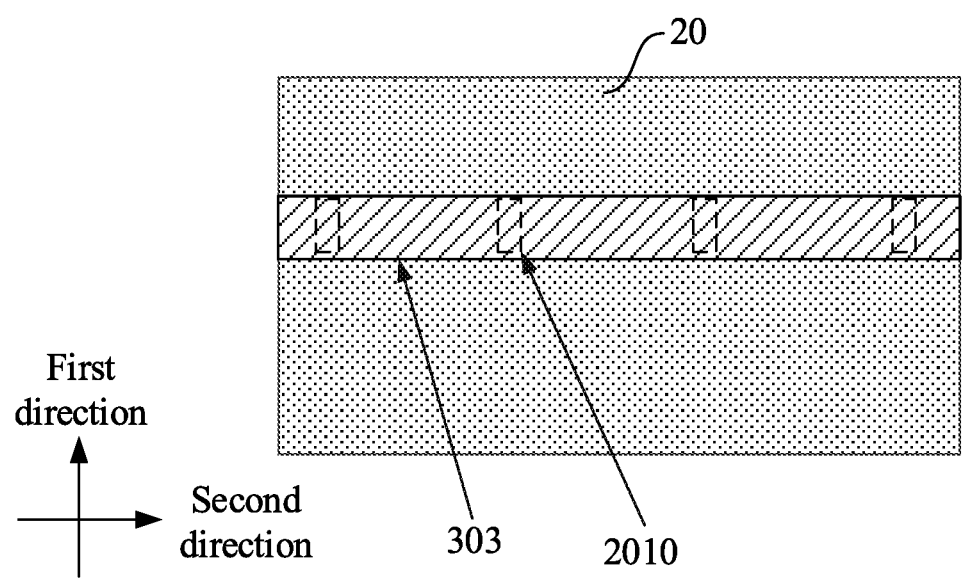
FIG. 11 is yet another enlarged view of region N in FIG. 2 provided by an embodiment of the present disclosure.

FIG. 11 is an enlarged view of a region N in FIG. 2.

In FIG. 11, the orthographic projection of the first groove structure 2010 on the base substrate fully falls within the range of the orthographic projection of the second lead 303 on the base substrate 10, and the size of the first groove structure 2010 in the first direction is smaller than a size of the second lead 303 in the second direction.

In an embodiment, the first conductive layer 2 may include a the plurality of first conductive parts 20 having different sizes in the second direction, if the first conductive parts 20 do not overlap with the second conductive part 30, the space between the two adjacent groove structures in the first hollowed-out portion 201 in the second direction is in positive correlation with the size, in the second direction, of the first conductive part to which the first hollowed-out portion belongs. Specifically, the ratio of the space between the two adjacent groove structures in the second direction to the size, in the second direction, of the first conductive part 20 corresponding thereto may be 8%-10%, for example, 100-200 μm.

Figure 12:
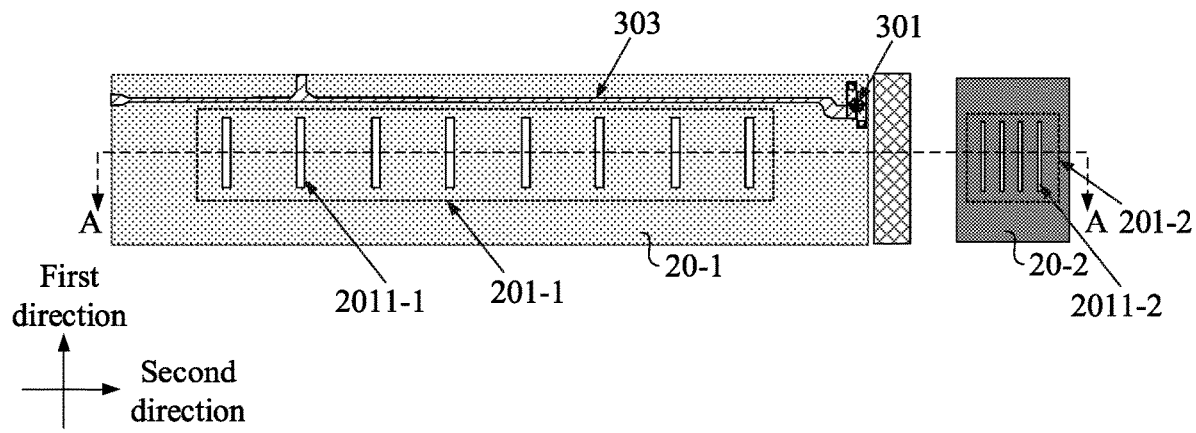
FIG. 12 is an enlarged view of a region F in FIG. 2 provided by an embodiment of the present disclosure.

FIG. 12 is an enlarged view of a region F in FIG. 2. It can be seen from FIG. 12 that the first conductive layer 2 includes two first conductive parts having different sizes in the second direction, 20-1 and 20-2. A size of the first conductive part 20-1 in the second direction is larger than a size of the first conductive part 20-2 in the second direction, and a space between groove structures 2011-1 in a first hollowed-out portion 201-1 in the first conductive part 20-1 is larger than a space between groove structures 2011-2 in a first hollowed-out portion 201-2 in the first conductive part 20-2.

Figure 13:
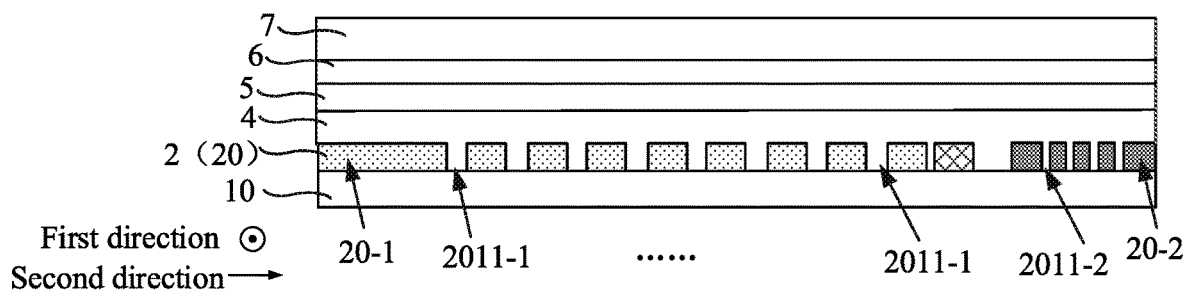
FIG. 13 is a schematic sectional view along a direction indicated by line A-A in FIG. 12 provided by an embodiment of the present disclosure.

FIG. 13 is a schematic sectional view along a direction indicated by line A-A in FIG. 12.

In FIG. 12, the first hollowed-out portion 201-1 does not overlap with the second conductive part 30, and the first hollowed-out portion 201-2 does not overlap with the second conductive part 30, so the second conductive part 30 is not shown in FIG. 13.

If the first conductive layer 2 includes the plurality of first conductive parts 20 having different sizes in the second direction, and the first conductive parts 20 partially overlap with the second conductive part 30, the space between the groove structures in the first hollowed-out portion in the first conductive parts 20 in the second direction is in positive correlation with the size, in the second direction, of the first conductive part 20 corresponding thereto. Specifically, the ratio of the space between the two adjacent groove structures in the second direction to the size, in the second direction, of the first conductive part 20 corresponding thereto may be 0-8%. For example, the substrate size is 1850 mm*1500 mm, and the space between the groove structures in the second direction may be 5-10 mm.

Figure 14:
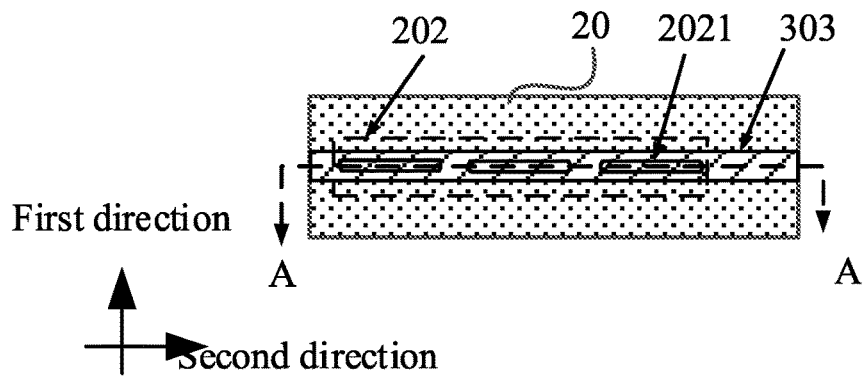
FIG. 14 is an enlarged view of a region G in FIG. 2 provided by an embodiment of the present disclosure.

In the embodiment of the present disclosure, the first conductive part 20 may further include a second hollowed-out portion 202 besides the first hollowed-out portion 201, as shown in FIG. 14, the second hollowed-out portion 202 includes a third groove structure 2021, the third groove structure 2021 extends in the second direction, and an orthographic projection of at least a part of the second conductive part 30 on the base substrate is located in a region defined by an orthographic projection of the second hollowed-out portion 202 on the base substrate. That is, in a thickness direction of the display substrate, the second conductive part 30 does not overlap with the first conductive part 20 at least partially, so short circuit therebetween due to static electricity, a manufacturing procedure technology, a test and other factors may be avoided in a non-overlapping region, and thus stability of the product properties is improved. Of course, in a case of being completely ideal, all the second conductive parts 30 do not overlap with the first conductive parts 20, so that the short circuit can be completely avoided.

In the present disclosure, two structures "overlap" means that an orthographic projection of one of the two structures on the base substrate at least partially overlaps with an orthographic projection of another structure on the base substrate.

In an embodiment, the second hollowed-out portion 202 may include one third groove structure, or may include a plurality of third groove structures. If the second hollowed-out portion 202 includes one third groove structure 2021, the third groove structure 2021 extends in the second direction, so the second hollowed-out portion 202 also extends in the second direction. If the second hollowed-out portion 202 includes the plurality of third groove structures 2021, the plurality of third groove structures 2021 may be distributed in the first direction, that is, the second hollowed-out portion 202 extends in the first direction, or the plurality of third groove structures 2021 may be also distributed in the second direction, that is, the second hollowed-out portion 202 extend in the second direction.

FIG. 14 is an enlarged view of a region G in FIG. 2.

The first conductive part 20 includes the second hollowed-out portion 202, the second hollowed-out portion 202 includes three third groove structures 2021 extending in the second direction and distributed in the second direction, and orthographic projections of the third groove structures 2021 fully fall within the orthographic projection of the second lead 303.

It needs to be noted that the third groove structures 2021 are covered with the second lead 303, so the groove structure in FIG. 12 is represented in dotted line.

Figure 15:
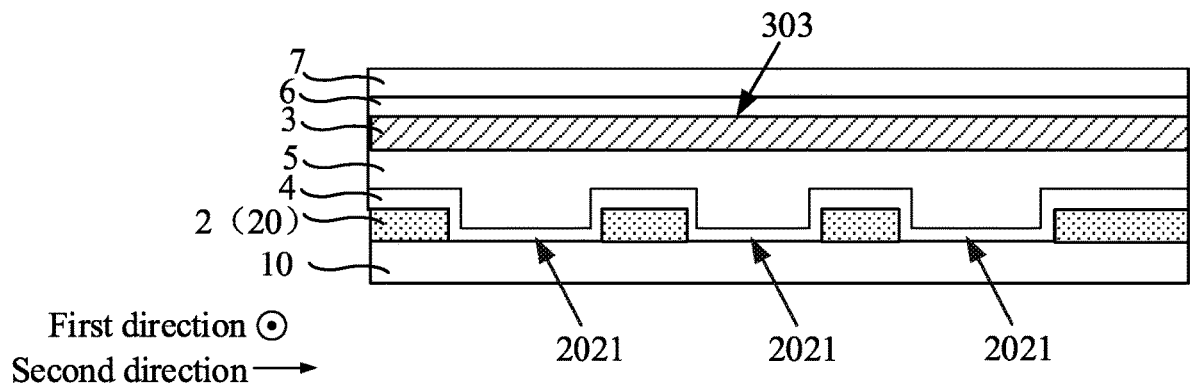
FIG. 15 is a schematic sectional view along a direction indicated by line A-A in FIG. 14 provided by an embodiment of the present disclosure.

FIG. 15 is a schematic sectional view along a direction indicated by line A-A in FIG. 14.

By means of the second hollowed-out portion 202, on the one hand, the adhesion between the first conductive layer and a film layer can be enhanced, and on the other hand, probability of occurrence of a short circuit phenomenon between the first conductive part 20 and the second conductive part 30 can be lowered.

During specific implementation, the orthographic projection of at least a part of the second conductive parts 30 on the base substrate 10 is located in the region defined by the orthographic projection of the second hollowed-out portion 202 on the base substrate 10.

The second hollowed-out portion 202 is to hollow out a region of an overlapping part of the first conductive part 20 and the second conductive part 30, so the short circuit due to static electricity, the manufacturing procedure technology, the test and other factors in the overlapping region of the first conductive part 20 and the second conductive part 30 can be avoided, and thus the stability of the product properties cannot be affected.

Furthermore, a certain gap may be set between an edge of an orthographic projection of a part, corresponding to the second conductive part 202, in the second conductive part 30 and an edge of an orthographic projection of the second hollowed-out portion 202 on the base substrate 10, so a certain distance is provided between the edges of the second conductive part 30 and the first conductive part 20, and probability of occurrence of the short circuit between them is further lowered.

In the embodiment of the present disclosure, the second conductive part 30 may include at least one of the bonding pad 301, the first lead 302, the second lead 303, or a function unit (the test conductive part 304).

In an embodiment, the second conductive part 30 includes a plurality of groups of bonding pads 301, and each group of bonding pads includes a plurality of secondary bonding pads. Orthographic projections of at least a part of secondary bonding pads on the base substrate 10 are respectively located in regions defined by orthographic projections of the second hollowed-out portions 202 in a one-to-one correspondence, and a periphery of an orthographic projection of each of the secondary bonding pads is spaced from an edge of an orthographic projection of the corresponding second hollowed-out portion.

In the implementation, the bonding pad 301 may be a conductive pattern used for finishing electrical bonding with the electronic element, and the electronic element includes a light-emitting diode, a sensor, a driving chip and the like.

Figure 16:
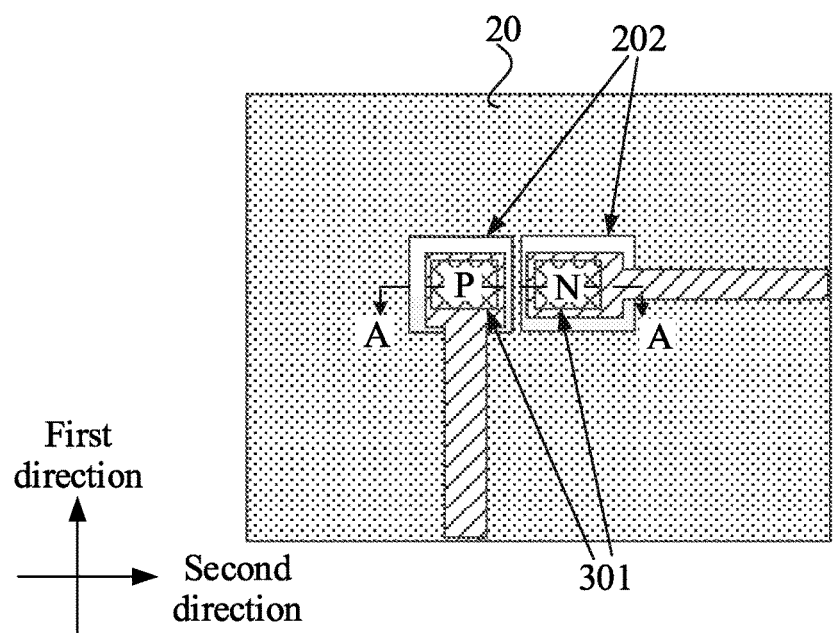
FIG. 16 is schematic structural diagram of a bonding pad provided by an embodiment of the present disclosure.

Referring to FIG. 16, taking a bonding pad used for installing the light-emitting diode for example, the bonding pad 301 includes two secondary bonding pads, one of which is a secondary bonding pad P and the other of which is a secondary bonding pad N.

In the embodiment, the first conductive part 20 is a common voltage line GND, and the bonding pad of the light-emitting diode overlaps with the common voltage line GND in the thickness direction of the display substrate. In the thickness direction of the substrate, an orthographic projection of the secondary bonding pad P on the base substrate 10 is located in a region defined by an orthographic projection of a third groove structure 2021 in the second hollowed-out portion 202, and an edge of a periphery of the orthographic projection of the secondary bonding pad is spaced from an edge of the orthographic projection of the third groove structure 2021. Likewise, an orthographic projection of the secondary bonding pad N on the base substrate 10 is located in a region defined by an orthographic projection of another third groove structure 2021 in the second hollowed-out portion 202, and an edge of a periphery of the orthographic projection of the secondary bonding pad N is spaced from an edge of the orthographic projection of the third groove structure 2021.

In the embodiment, the two groove structures are separated by the non-hollowed part of the first conductive part 20, so that each of the groove structures corresponds to the corresponding secondary bonding pad.

Figure 17:
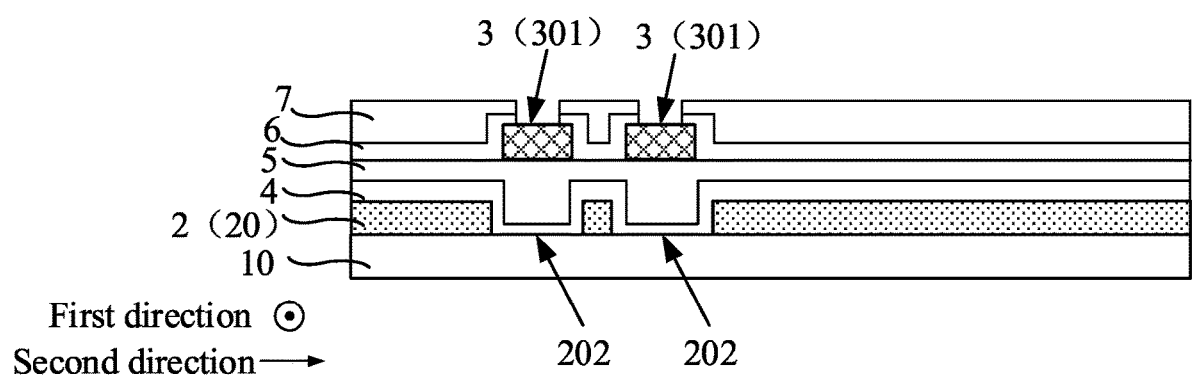
FIG. 17 is a sectional view along a direction indicated by line A-A in FIG. 16 provided by an embodiment of the present disclosure.

FIG. 17 is sectional view along a direction indicated by line A-A in FIG. 16.

A region of the first conductive part 20 directly facing the secondary bonding pad P and the secondary bonding pad N is hollowed out, so that the secondary bonding pad P and the secondary bonding pad N do not overlap with the first conductive part 20 below, and thus a problem of a short circuit between the bonding pad and the first conductive part 20 due to welding, die bond and other factors is avoided.

Figure 18:
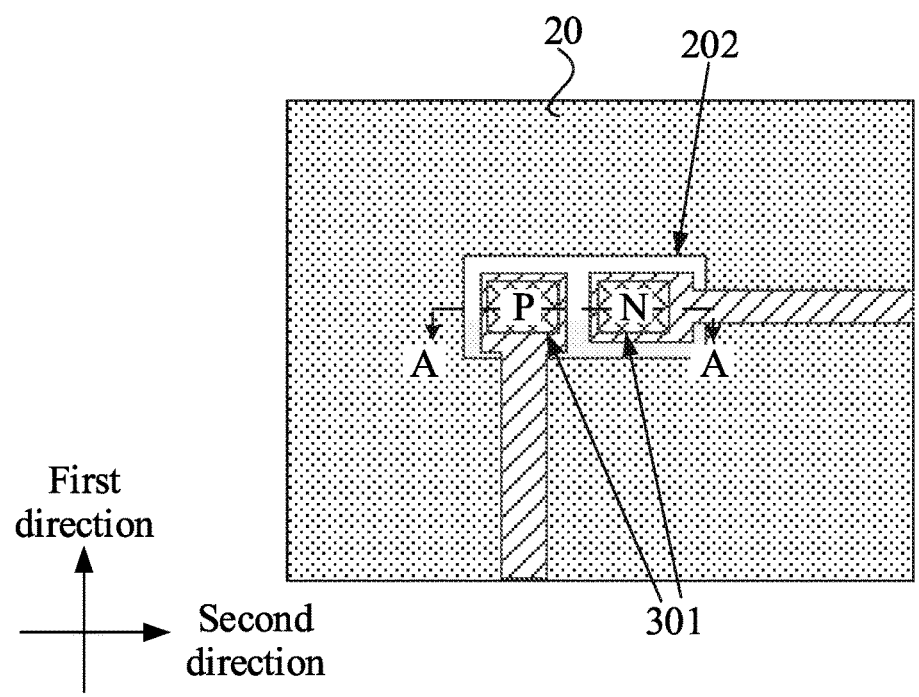
FIG. 18 is another schematic structural diagram of bonding pad provided by an embodiment of the present disclosure.

Furthermore, the third groove structures 2021 corresponding to each of the secondary bonding pads in the same group of bonding pads can communicate with each other. Referring to FIG. 18. In the embodiment, the two third groove structures 2021 communicate with each other to form a groove structure, that is, the orthographic projections of the secondary bonding pad P and the secondary bonding pad N are located in a region defined by an orthographic projection of a large groove structure. The structure can avoid the short circuit of the secondary bonding pad P, the secondary bonding pad N and the first conductive part 20 and also lower technical difficulty of hollowing out the first conductive part 20.

Figure 19:
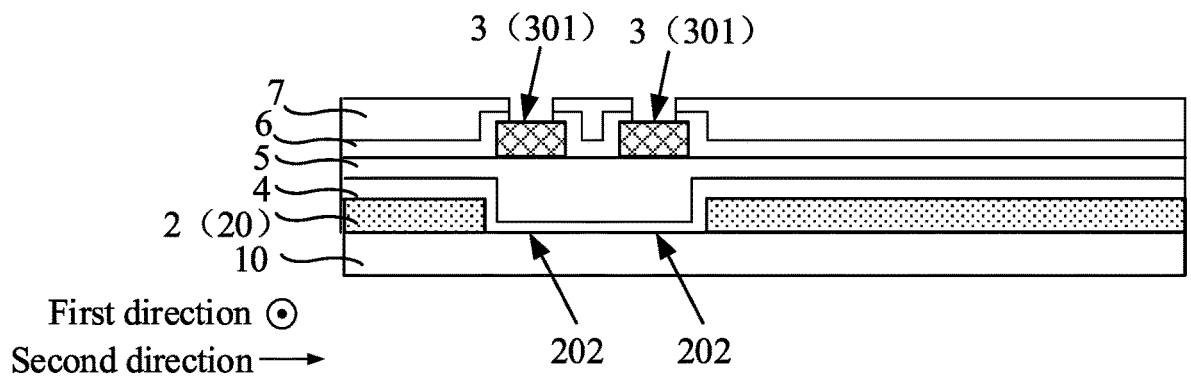
FIG. 19 is a sectional view along a direction indicated by line A-A in FIG. 18 provided by an embodiment of the present disclosure.

FIG. 19 is a sectional view along a direction indicated by line A-A in FIG. 18.

In the embodiment, a shape of the secondary bonding pad and a shape of the third groove structure 2021 may be the same, which may be approximately rectangular.

Figure 20:
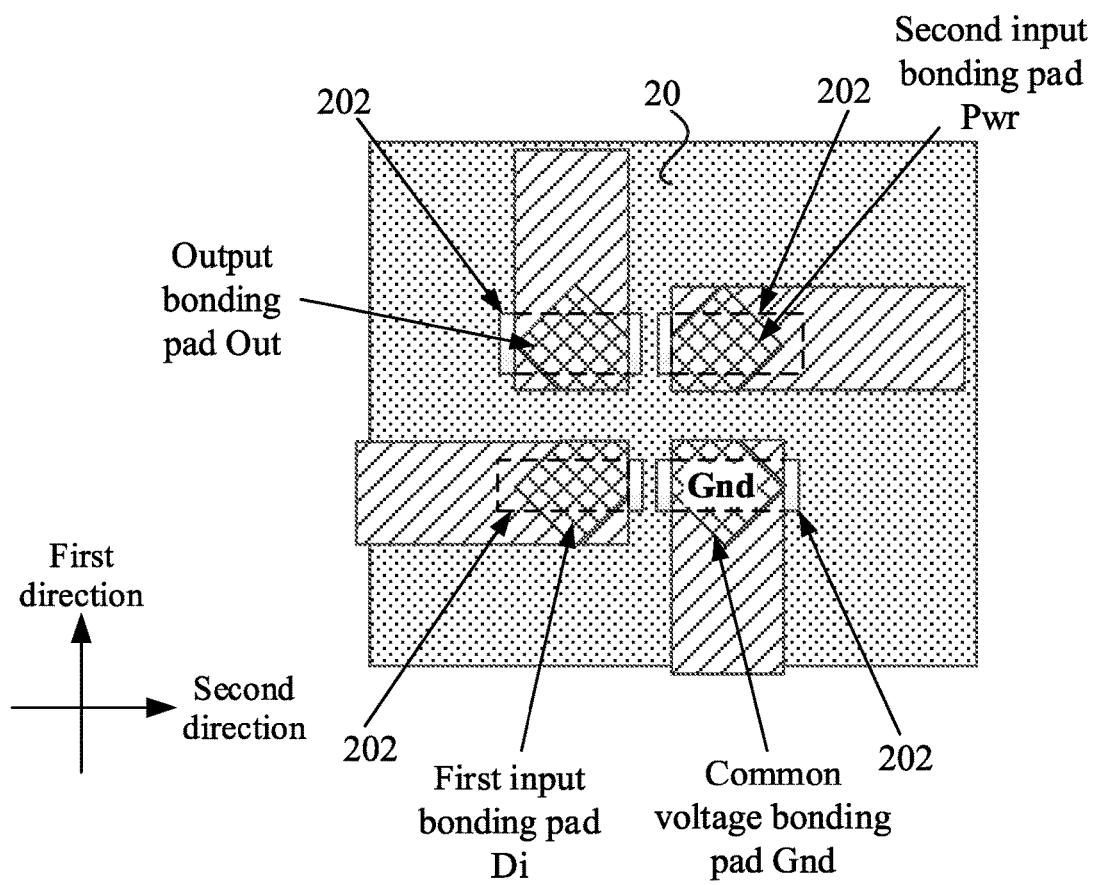
FIG. 20 is a schematic structural diagram of yet another bonding pad provided by an embodiment of the present disclosure.

Referring to FIG. 20, taking a bonding pad used for installing the driving chip for example, the bonding pad includes four secondary bonding pads, which are a first input bonding pad Di, a second input bonding pad Pwr, an output bonding pad Out and a common voltage bonding pad Gnd respectively. The first input bonding pad Di is configured to receive a first input signal, and the first input signal is, for example, an address signal, so as to be used for gating of a driving chip in a corresponding address. For example, the first input signal may be an address signal of 8 bit from the source address line DI, and a to-be-transmitted address can be known by parsing the address signal. The second input bonding pad Pwr is configured to receive a second input signal, and the second input signal is, for example, a power line carrier communication signal from the source power line PWR. The second input signal not only provides electric energy for the driving chip, but also transmits communication data to the driving chip, and the communication data can be used for controlling a light-emitting duration of the corresponding light-emitting unit and accordingly controlling its visual light-emitting brightness. The output bonding pad Out is configured to output a driving signal. For example, the driving signal may be driving voltage from the driving voltage line VLED and used for driving a light-emitting element to emit light. The common voltage bonding pad Gnd is configured to receive a common voltage signal, for example, a ground signal from the common voltage line GND.

In the embodiment, the first conductive part 20 is the common voltage line GND, and the bonding pad of the driving chip overlaps with the common voltage line GND in the thickness direction of the display substrate. The first conductive part 20 includes four second hollowed-out portions 202. In the thickness direction of the substrate, an orthographic projection of the first input bonding pad Di on the base substrate 10 is located in a region defined by an orthographic projection of the first second hollowed-out portion 202, and an edge of a periphery of the orthographic projection of the first input bonding pad Di is spaced from an edge of the orthographic projection of the second hollowed-out portion 202. An orthographic projection of the second input bonding pad Pwr on the base substrate 10 is located in a region defined by a orthographic projection of the second hollowed-out portion 202, and an edge of a periphery of the orthographic projection of the second input bonding pad Pwr is spaced from an edge of the orthographic projection of the second hollowed-out portion 202. An orthographic projection of the output bonding pad Out on the base substrate 10 is located in a region defined by an orthographic projection of the third second hollowed-out portion 202, and an edge of a periphery of the orthographic projection of the output bonding pad Out is spaced from an edge of the orthographic projection of the second hollowed-out portion 202. An orthographic projection of the common voltage bonding pad Gnd on the base substrate 10 is located in a region defined by an orthographic projection of the fourth second hollowed-out portion 202, and an edge of a periphery of the orthographic projection of the common voltage bonding pad Gnd is spaced from an edge of the orthographic projection of the second hollowed-out portion 202. In the embodiment, the four second hollowed-out portions 202 are separated by the non-hollowed part of the first conductive part 20 so that each of the second hollowed-out portions 202 corresponds to the corresponding secondary bonding pad.

A region of the first conductive part 20 directly facing the four secondary bonding pads is hollowed out so that the four secondary bonding pads do not overlap with the first conductive part 20 below any more, and thus the problem of the short circuit between the bonding pad and the first conductive part 20 is avoided.

Figure 21:
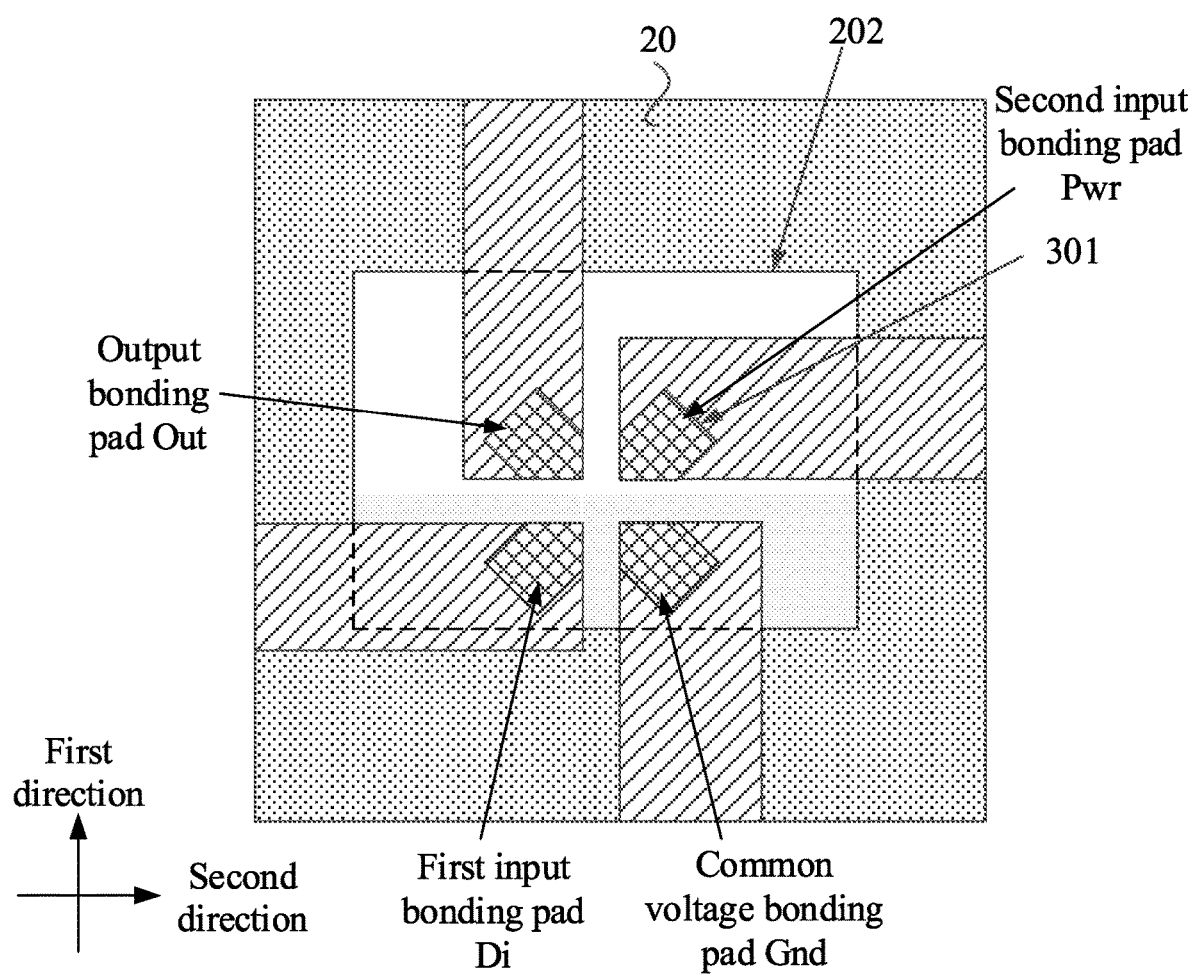
FIG. 21 is a schematic structural diagram of yet another bonding pad provided by an embodiment of the present disclosure.

Furthermore, the second hollowed-out portions 202 corresponding to each of the secondary bonding pads in the same group of bonding pads can communicate with each other, so that hollowing-out difficulty is lowered. Referring to FIG. 21, in the embodiment, the four second hollowed-out portions 202 communicate with one another to form a second hollowed-out portion 202, that is, the orthographic projections of the first input bonding pad Di, the second input bonding pad Pwr, the output bonding pad Out and the common voltage bonding pad Gnd are located in a region defined by an orthographic projection of the same large second hollowed-out portion 202. The structure can not only avoid the short circuit between each of the secondary bonding pads and the first conductive part 20 below, but also lower an accuracy requirement of hollowing out the first conductive part 20.

Figure 22:
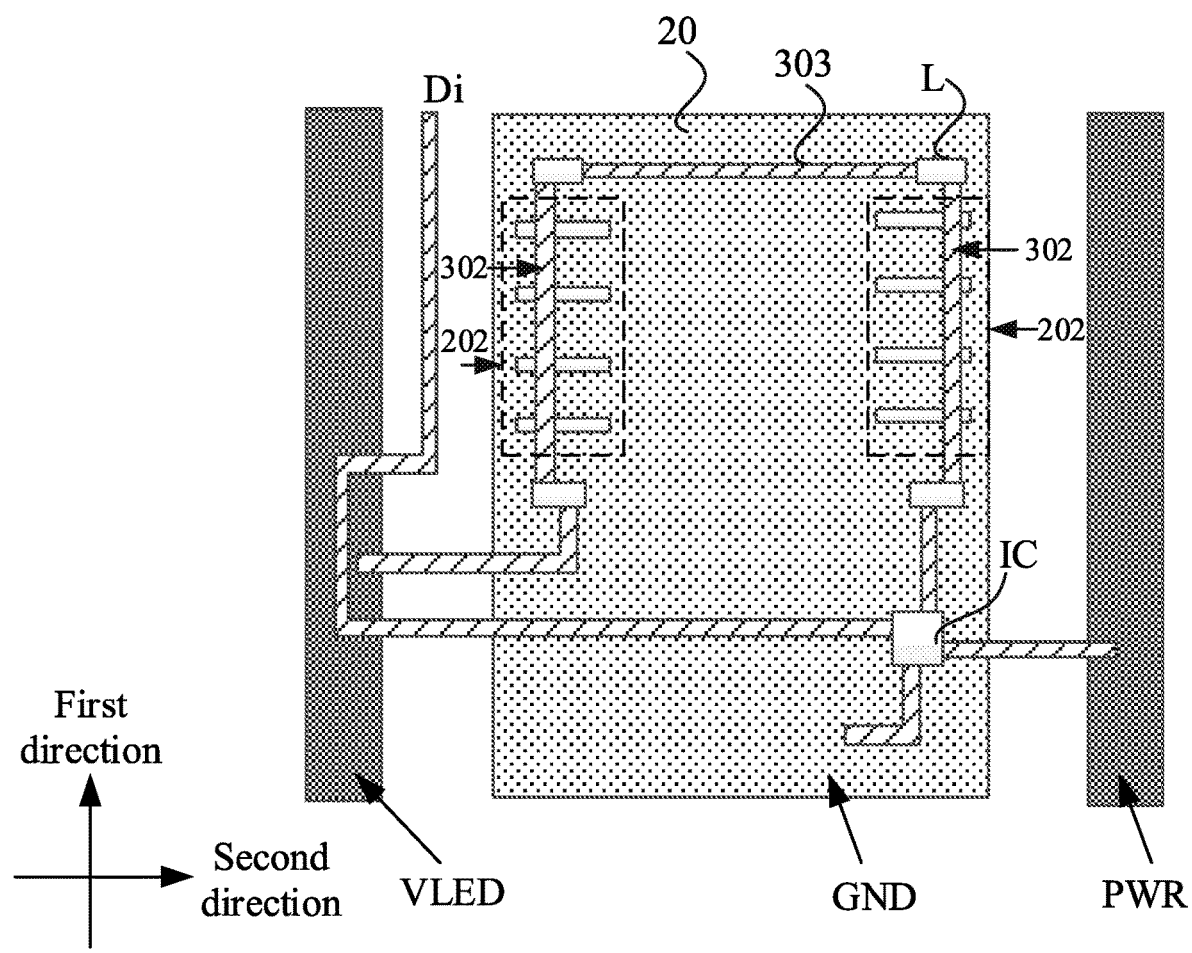
FIG. 22 is a schematic structural diagram of a first lead provided by an embodiment of the present disclosure.

In FIG. 22, the electronic element already finishes bonding connection to the corresponding bonding pads 3011 or 3012 in FIG. 2, for example, the light-emitting device L is corresponding connected to the bonding pad 3011, and the driving chip is corresponding connected to the bonding pad 3012.

In the embodiment, a shape of the secondary bonding pad is approximately pentagonal, and a shape of the second hollowed-out portion 202 is approximately rectangular.

In other embodiments, each of the bonding pads may also have other quantities of secondary bonding pads, for example, having one, or three or other quantities of secondary bonding pads. Correspondingly, a corresponding quantity of second hollowed-out portions may be included, so that a second hollowed-out portion is correspondingly below each of the secondary bonding pads, and overlapping is prevented from being formed at the secondary bonding pads. It will not be repeated herein.

In an embodiment, referring to FIG. 22, the second conductive part 30 includes the first lead 302, and the first lead 302 extends in the first direction in the figure. As shown in the figures, the first lead 302 is a lead in the first direction extending from an LED. In other embodiments, the first lead 302 may also be a lead in the first direction extending from the bonding pad of the driving chip.

Continuing referring to FIG. 22, in the embodiment, the first conductive part 20 may also be the common voltage line GND, the first lead extending in the first direction overlaps with a part of the common voltage line GND extending in the first direction in the thickness direction of the substrate.

The first conductive part 20 includes the second hollowed-out portion 202, the second hollowed-out portion 202 includes the four third groove structures 2021, and the third groove structures 2021 extend in the second direction and are distributed in the first direction. An orthographic projection of at least one section of the first lead 302 on the base substrate 10 is located in the region defined by the orthographic projection of the second hollowed-out portion 202, that is, the first conductive part 20 correspondingly below the at least one section of the first lead 302 is hollowed out, so the first lead 302 does not overlap with the first conductive part 20 below in the region any more, and thus the short circuit between the first lead 302 and the first conductive part 20 due to static electricity, the test and the manufacturing procedure is avoided.

A region in the first conductive part 20 under the first lead 302 may be fully hollowed out, or only one section of it may be hollowed out. That is, the second hollowed-out portion 202 may be arranged below the whole first lead 302 or may be arranged only below a part of region of the first lead 302. In FIG. 22, the second hollowed-out portion 202 is correspondingly below the first lead 302, in other implementations, at least two third groove structures 2021 may also communicate with each other as long as it is guaranteed that the groove structures which communicate with each other are distributed in the first direction and extend in the second direction, and thus hollowing-out difficulty is lowered.

It needs to be noted that in FIG. 22, the light-emitting diode or the driving chip is already bonded in a position of the bonding pad 301, so the light-emitting diode or the driving chip covers the bonding pad 301, and what is actually seen in the figure is the light-emitting diode or the driving chip.

Figure 23:
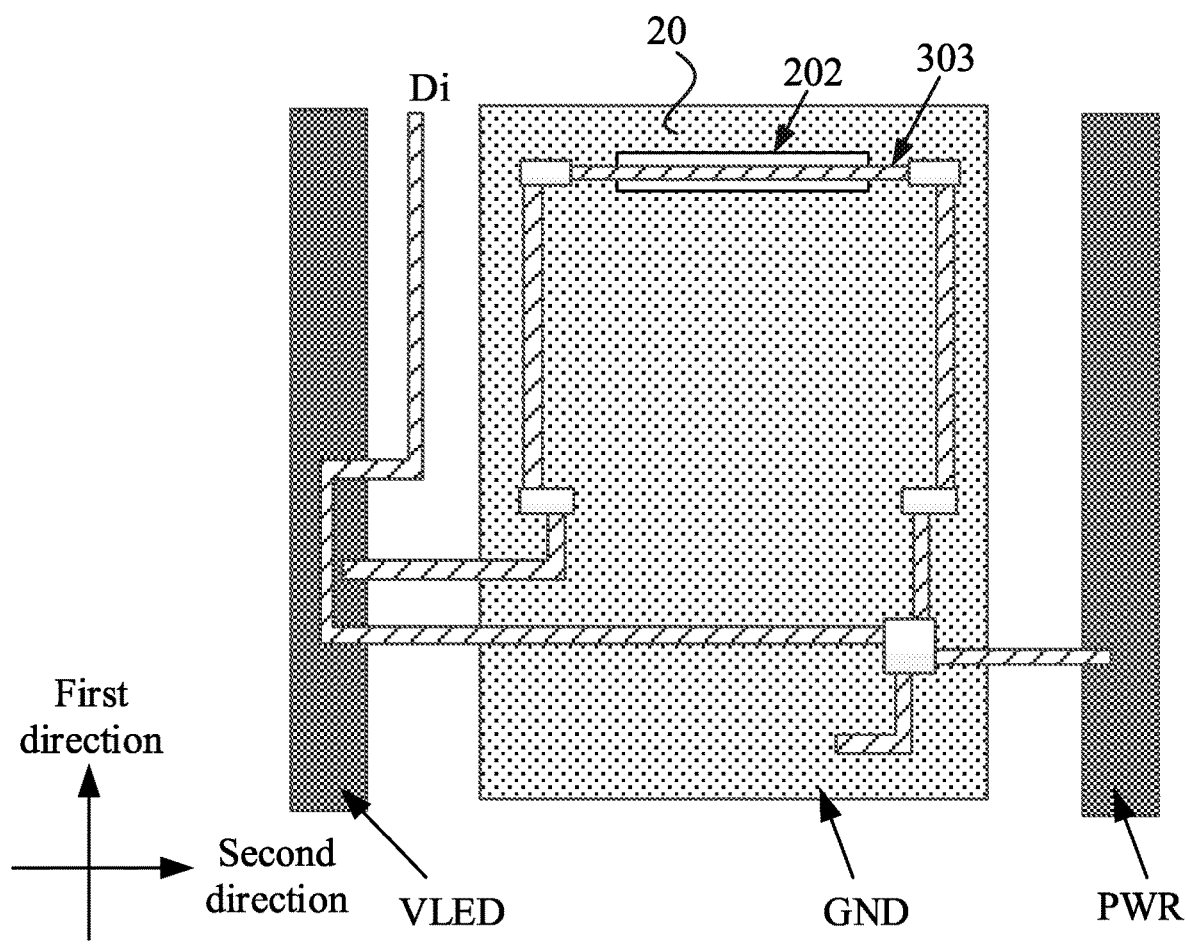
FIG. 23 is a schematic structural diagram of a second lead provided by an embodiment of the present disclosure.

In an embodiment, referring to FIG. 23, the second conductive part 30 may also include the second lead 303, and the second lead 303 extends in the second direction. The second lead 303 may be a lead in the second direction extending from the bonding pad of the driving chip, or may be a lead in the second direction extending from the LED.

In the embodiment, the first conductive part 20 is also the common voltage line GND, and the second lead 303 extending in the second direction overlaps with the part of the common voltage line GND extending in the first direction in the thickness direction of the substrate.

The first conductive part 20 includes the second hollowed-out portion 202, the second hollowed-out portion 202 is located in the part of the first conductive part 20 extending in the first direction, and an orthographic projection of at least one section of the second lead 303 on the base substrate 10 is located in the region defined by the orthographic projection of the second hollowed-out portion 202. That is, the first conductive part 20 correspondingly below the at least one section of the second lead 303 is hollowed out, so the second lead 303 does not overlap with the first conductive part 20 below in the region any more, and thus the short circuit between the second lead 303 and the first conductive part 20 due to static electricity, the test and the manufacturing procedure is avoided.

A portion of the first conductive part below the second lead 303 may be fully hollowed out, or only one section of it may be hollowed out. That is, the second hollowed-out portion 202 may be arranged below the whole second lead 303, or may be arranged only below a part of region of the second lead 303.

Figure 24:
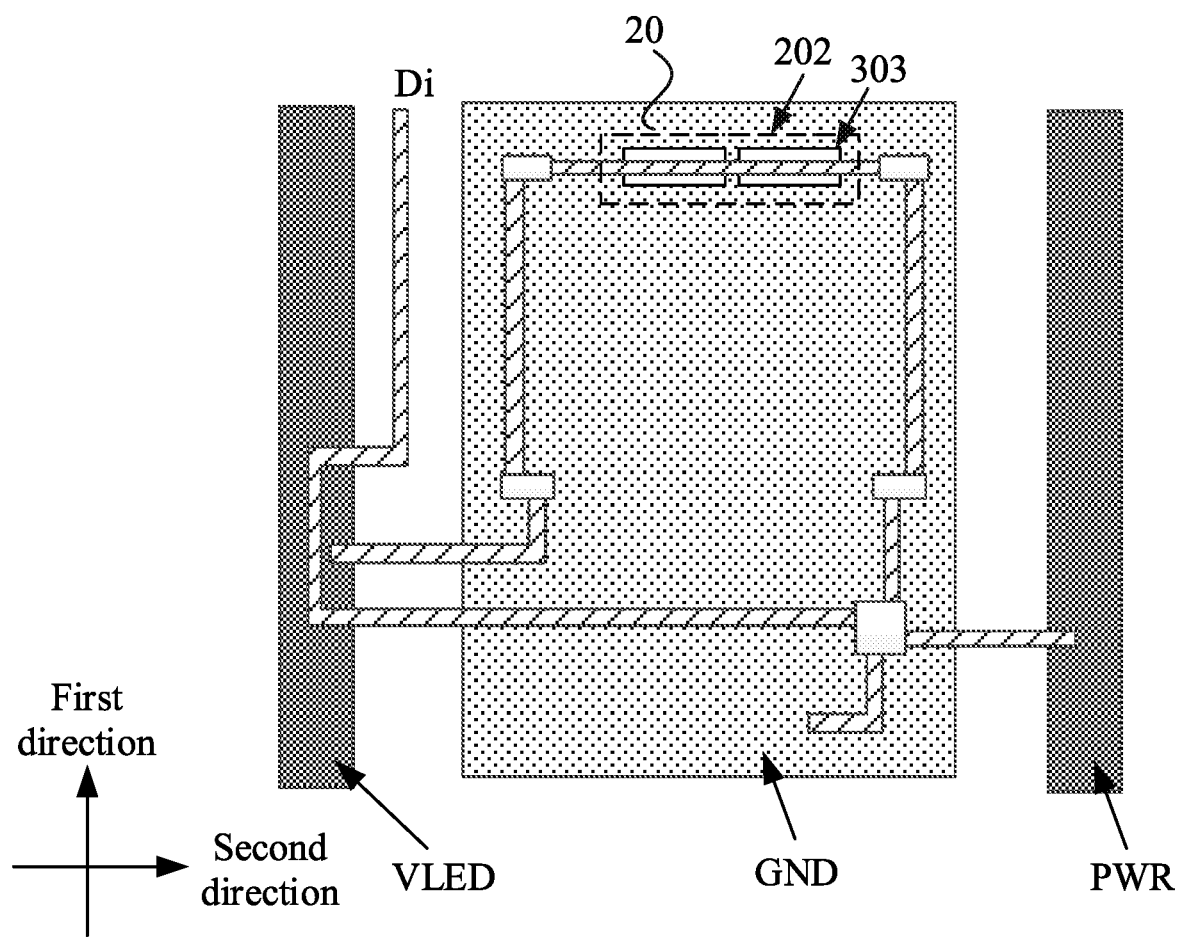
FIG. 24 is a schematic structural diagram of a test conductive part provided by an embodiment of the present disclosure.

In FIG. 23, the second hollowed-out portion 202 below the second lead 303 only includes one third groove structure 2021. In other implementations, may also contain a plurality of third groove structures, as shown in FIG. 24. When the second hollowed-out portion 202 includes the plurality of third groove structures, at least two third groove structures may also communicate with each other, and thus hollowing-out difficulty is lowered.

In the embodiment, the first conductive part 20 below the second lead 303 is hollowed out, so the short circuit between the second lead 303 and the first conductive part 20 due to static electricity and the manufacturing procedure may be avoided.

In the present disclosure, in the first direction, the second hollowed-out portion 202 corresponding to the second lead 303 may be located at an upper edge or a lower edge of the first conductive part 20, or may be located in a middle of the first conductive part 20. Therefore, an edge of an orthographic projection of at least one side of an upper side or a lower side of the second lead 303 is spaced from the edge of the orthographic projection of the second hollowed-out portion 202. The second hollowed-out portion 202 shown in FIG. 23 is a close opening region, an orthographic projection of one section of the second lead 303 overlaps with the orthographic projection of the second hollowed-out portion 202, and the edge of the orthographic projection of the at least one side of the upper side or the lower side of the second lead 303 is spaced from the edge of the orthographic projection of the second hollowed-out portion 202.

It needs to be noted that the second lead 303 extends in the second direction, so the second hollowed-out portion 202 also extends in the second direction; and as for the second hollowed-out portion 202 in one first conductive part 20, a length of the second hollowed-out portion 202 in the second direction should be smaller than width of the first conductive part 20, otherwise, the first conductive part 20 will be cut off. Therefore, when the second lead 303 crosses through the whole first conductive part 20 in the second direction, only a part of the first conductive part below the second lead 303 is hollowed out. It can be understood that the larger the length of the second hollowed-out portion 202 in the second direction is, the higher the influence on IR drop of the first conductive part 20 extending in the first direction will be, which leads to lowered signal intensity. The larger the length of the second hollowed-out portion 202 in the second direction is, the fewer the overlapping region of the second lead 303 and the first conductive part 20 will be, and the more difficult occurrence of the static electricity will be.

In an actual product, a length of the second hollowed-out portion 202 in the second direction needs to be set by comprehensively considering factors in two aspects. Besides, the second lead 303 may also simultaneously cross the plurality of first conductive parts 20 extending in the first direction, so one or more groove structures may be arranged in each of the first conductive parts 20. When one second lead 303 does not cross the first conductive part 20, that is, the orthographic projection of the second lead 303 is located only in the orthographic projection of one first conductive part 20, the corresponding second hollowed-out portion 202 may include a plurality of third groove structures, respectively corresponding to a plurality of sections of the second lead 303.

In other embodiments, the second direction in which the second lead 303 extends may be not perpendicular to the first direction. It should be guaranteed that the second hollowed-out portion 202 corresponding to the second lead 303 will not cut off the first conductive part 20 and influence on IR drop should be reduced as much as possible in spite of how the directions are set.

In the embodiment, the shape of the first lead 302 or the second lead 303 is approximately a strip shape in general, so the shape of the third groove structure in the second hollowed-out portion 202 is also approximately a strip shape. The present disclosure does not limit the specific shape of the third groove structure in the second hollowed-out portion 202, which may be consistent or inconsistent with the shape of the lead.

In an embodiment, the second conductive part 30 may also include several function units configured to realize specific functions. The function unit may include the bonding pad, the first lead, the second lead or the test conductive part, and description is made below by taking the function unit being the test conductive part as an example.

The test conductive part 304 is electrically connected to the bonding pad 301, the first lead 302 or the second lead 303 and configured to detect electrical properties of the bonding pad 301 or the first lead 302 or the second lead 303.

Figure 25:
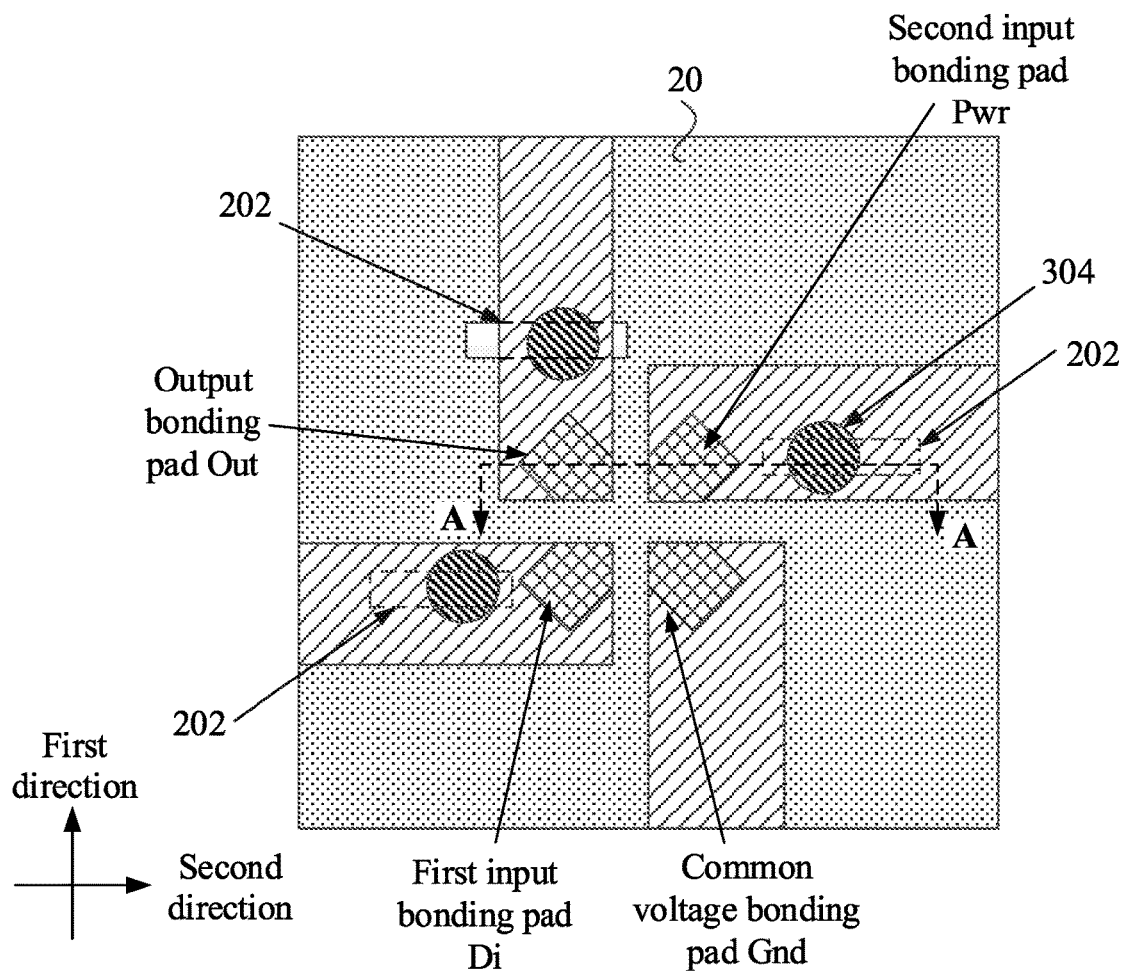
FIG. 25 is a schematic structural diagram of a bonding pad group and a first lead provided by an embodiment of the present disclosure.

For example, the current or voltage property of the bonding pad may be tested by using a probe pricking test method. Specifically, FIG. 25 shows the test conductive parts 304 corresponding to the three secondary bonding pads in the bonding pad of the driving chip and the second hollowed-out portion 202, the three test conductive parts 304 are respectively correspondingly arranged nearby the first input bonding pad Di, the second input bonding pad Pwr and the output bonding pad Out, one ends are connected with the secondary bonding pads and configured to test a voltage and/or a current of the secondary bonding pads, and the other ends may be also connected with the first lead or the second lead. A film layer on an upper portion of the test conductive part 304 is opened, so that the test conductive part 304 is exposed and the probe pricking test can be performed here.

As shown in FIG. 25, one second hollowed-out portion 202 may include three third groove structures 2021, orthographic projections of the three test conductive parts 304 on the base substrate are located in the orthographic projections of the third groove structures 2021 in a one-to-one corresponding mode, and the orthographic projections of the test conductive parts 304 are spaced from edges of the orthographic projections of the corresponding third groove structures 2021. In other words, the first conductive part 20 correspondingly below the test conductive part 304 is hollowed out, so the test conductive part 304 does not overlap with the first conductive part 20 below in the region any more, and thus the short circuit or inaccurate test caused by possible pricking the test conductive part 304 and making contact with the first conductive part 20 during the probe pricking test is avoided. The common voltage bonding pad Gnd is connected with the common voltage line GND through a via hole, so a current or a voltage of the common voltage bonding pad Gnd can be directly tested on the common voltage line GND.

Figure 26:
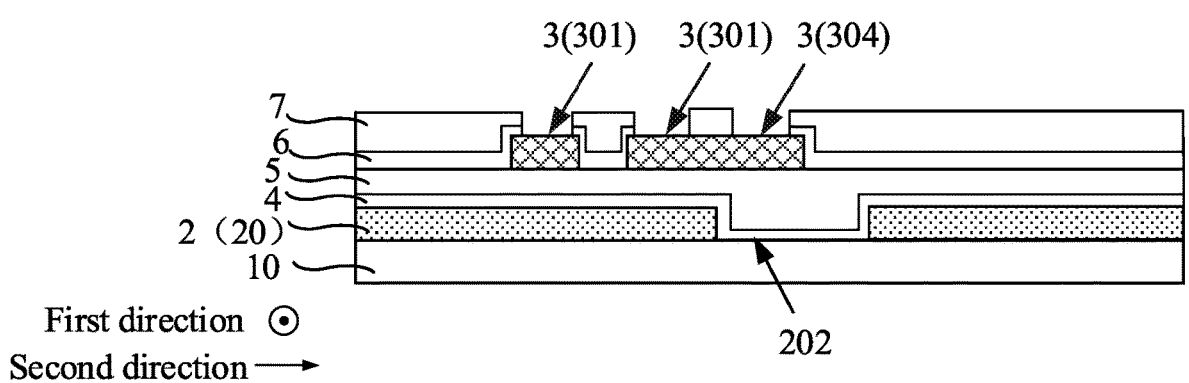
FIG. 26 is a sectional view along a direction indicated by line A-A in FIG. 25 provided by an embodiment of the present disclosure.

FIG. 26 is an enlarger view along a direction indicated by line A-A in FIG. 25.

In the embodiment, the quantity of the test conductive parts 304 is only an example, the specific quantity may be set according to demands, for example, one test conductive part 304 may be arranged only specific to one certain secondary bonding pad, and the quantity of the test conductive parts 304 is not specially limited by the present disclosure. In the embodiment, the three groove structures 2021 may communicate with one another, as shown in FIG. 27, and thus hollowing-out difficulty is lowered.

Figure 27:
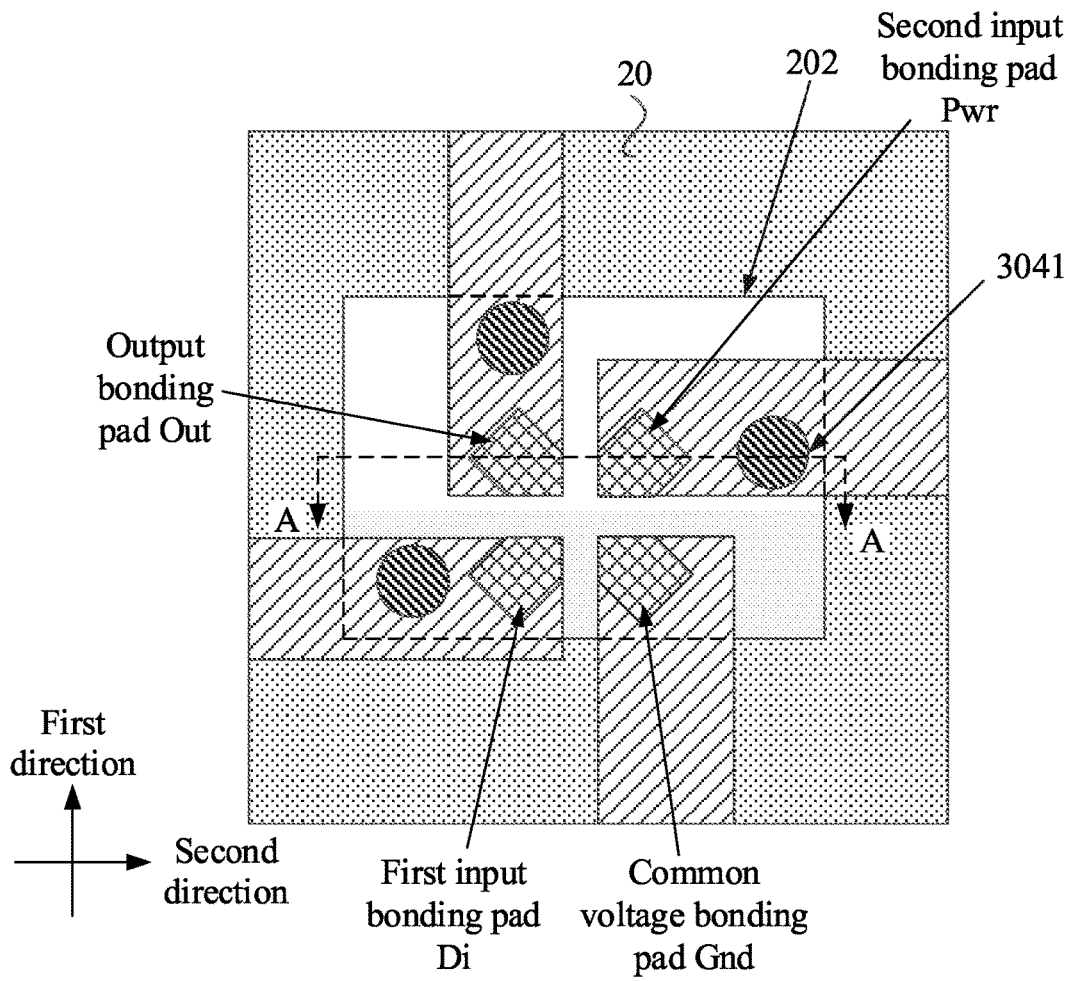
FIG. 27 is a schematic structural diagram of another bonding pad group and a first lead provided by an embodiment of the present disclosure.
Figure 28:
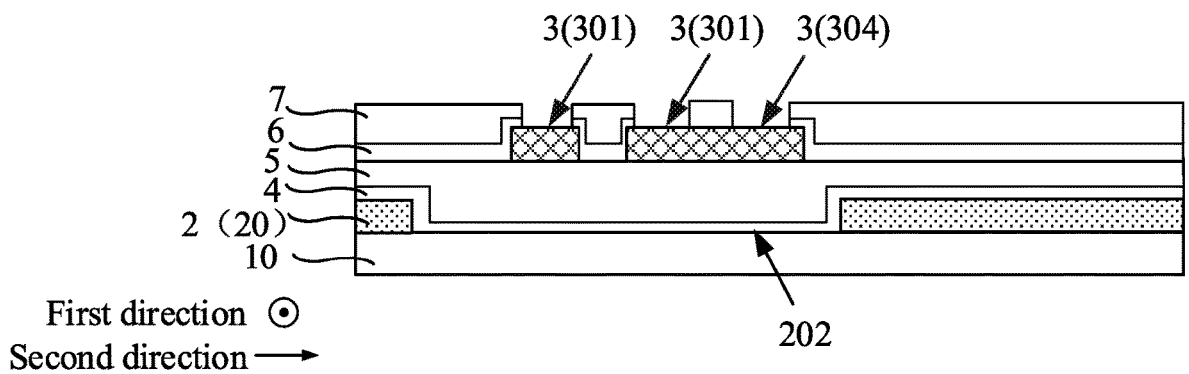
FIG. 28 is a sectional view along a direction indicated by line A-A in FIG. 27 provided by an embodiment of the present disclosure.

FIG. 28 is a sectional view along a direction indicated by line A-A in FIG. 27.

In an embodiment, the second conductive part includes a plurality of groups of bonding pads and the first leads in one-to-one correspondence with the plurality of groups of bonding pads, and the extending direction of arrangement of the plurality of groups of the bonding pads, the extending direction of the first leads and the extending direction of the first hollowed-out portion are the first direction. The orthographic projection of the first lead on the base substrate is covered by the orthographic projection of the second hollowed-out portion corresponding to the first lead on the base substrate, and/or orthographic projections of the plurality of groups of bonding pads on the base substrate are covered by the orthographic projection of the second hollowed-out portion on the base substrate.

Figure 29:
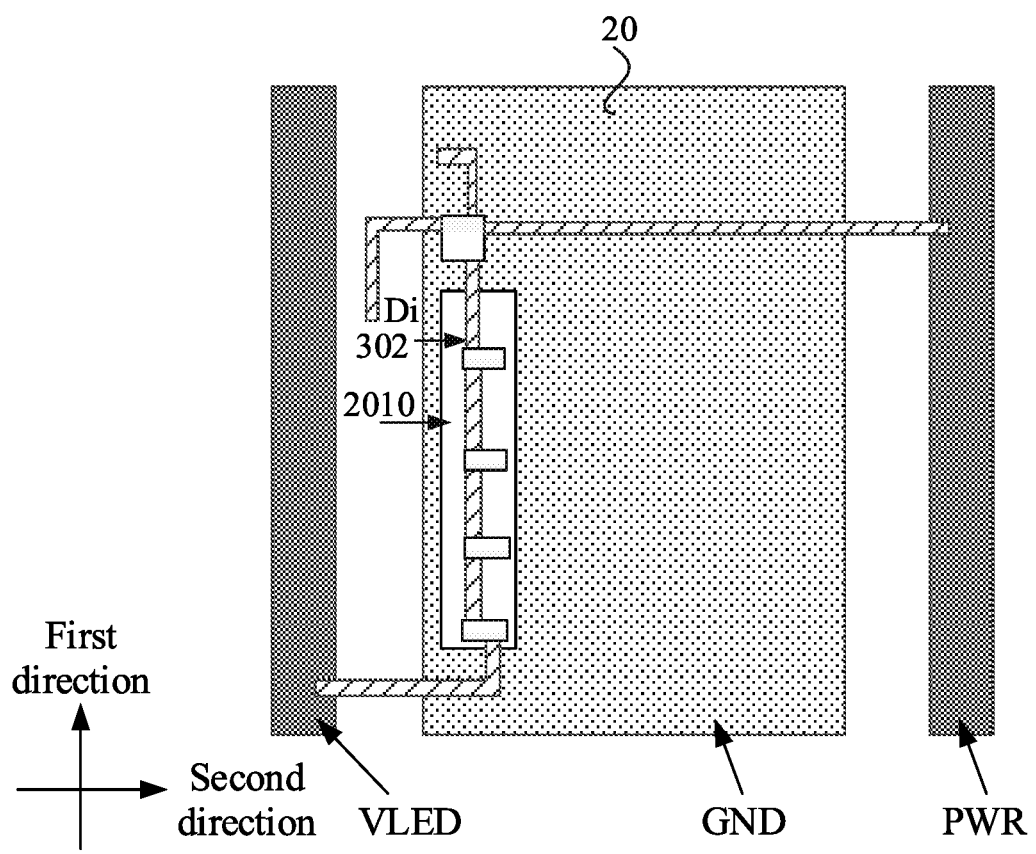
FIG. 29 is a schematic structural diagram of yet another bonding pad group and a first lead provided by an embodiment of the present disclosure.

As shown in FIG. 29, the orthographic projections of the first leads 302 and the plurality of groups of bonding pads 301 on the base substrate are located in the region of the orthographic projection of the first hollowed-out portion 201 on the base substrate.

The first conductive part 20 correspondingly below the at least one section of the first lead 302 is hollowed out, and/or the first conductive part 20 correspondingly below the at least one section of the plurality of groups of bonding pads is hollowed out, so the first leads 302 and the bonding pad do not overlap with the first conductive part 20 below in the region any more, and thus the short circuit between the first leads 302 as well as the bonding pads and the first conductive part 20 due to the static electricity, the test and the manufacturing procedure is avoided.

Various types of second conductive parts 10 and the hollowed-out portions of the corresponding first conductive parts are described in detail above. The display substrate of the present disclosure may only include any type of above second conductive part 10 and a hollowed-out portion corresponding thereto, or may include at least any two types of second conductive parts 10 and hollowed-out portions corresponding thereto. For example, the substrate may include the bonding pad and the first lead arranged in the first direction and further includes the first hollowed-out portion and the second hollowed-out portion; or may include the bonding pad and the test conductive part and further includes the first hollowed-out portion and the second hollowed-out portion; or may simultaneously include the bonding pad, the first lead, the second lead and the test conductive part 304 and further includes the first hollowed-out portion and the second hollowed-out portion, and so on, which is not listed one by one.

An implementation of the present disclosure further provides a display apparatus. The display apparatus includes the display substrate in the above implementation. The display apparatus includes the above display substrate, so it has the same beneficial effect, which is not described in detail here by the present disclosure.

Application of the display apparatus is not limited specifically by the present disclosure, which may be a TV, a notebook computer, a tablet PC, a wearable display device, a mobile phone, a vehicle-mounted display, a navigator, an e-book, a digital photo frame, an advertising lamp box and any product or component with a flexible display function.

Those skilled in the art will easily figure out other implementation solutions of the present disclosure after considering the specification and practicing the present disclosure disclosed here. The present disclosure intends to cover any variation, application or adaptive change of the present disclosure, which conform to a general principle of the present disclosure and include a known knowledge or conventional technical means in the technical field not disclosed by the present disclosure. The specification and the embodiments are only regarded as exemplary, and a true scope and spirit of the present disclosure are indicated by appended claims.

What is claimed is:

1. A display substrate, comprising:
   a base substrate;
   a first conductive layer, disposed on a side of the base substrate, wherein the first conductive layer comprises:
      a plurality of first conductive parts extending in a first direction and having different sizes in a second direction;
   a second conductive layer, disposed on a side of the first conductive layer facing away from the base substrate; and
   an insulation layer, disposed between the first conductive layer and the second conductive layer; wherein
      at least two first conductive parts each comprise a first hollowed-out portion, the first hollowed-out portion comprises a plurality of groove structures distributed in the second direction and extending in the first direction, and the first direction and the second direction produce angles.

2. The display substrate according to claim 1, wherein a size of the first hollowed-out portion in the second direction is in positive correlation with a size, in the second direction, of the first conductive part to which the first hollowed-out portion belongs, and a quantity of the groove structures in the first hollowed-out portion is in positive correlation with the size, in the second direction, of the first conductive part to which the first hollowed-out portion belongs.

3. The display substrate according to claim 2, wherein a ratio of the size of the first hollowed-out portion in the second direction to the size, in the second direction, of the first conductive part to which the first hollowed-out portion belongs is 20%-40%, and the size of the first hollowed-out portion in the second direction is a sum of sizes of all the groove structures in the first hollowed-out portion in the second direction.

4. The display substrate according to claim 2, wherein a ratio of a size of each of the groove structures in the first hollowed-out portion in the first direction to a size of the first conductive part in the first direction is 0.3%-0.5%.

5. The display substrate according to claim 2, wherein the groove structures in the first hollowed-out portion are distributed in the second direction in an equal-spacing mode; and/or
   a size of the first hollowed-out portion in the first direction is in positive correlation with a size, in the first direction, of the first conductive part to which the first hollowed-out portion belongs, and a quantity of first hollowed-out portions is in negative correlation with the size, in the first direction, of the first conductive part to which the first hollowed-out portion belongs.

6. The display substrate according to claim 5, wherein the first hollowed-out portions are distributed in the first direction in an equal-spacing mode.

7. The display substrate according to claim 2, wherein the second conductive layer comprises a second conductive part; and
the at least one first conductive part further comprises a second hollowed-out portion, and an orthographic projection of at least a part of the second conductive part on the base substrate is located in a region defined by an orthographic projection of the second hollowed-out portion on the base substrate.

8. The display substrate according to claim 7, wherein an edge of the orthographic projection of the part of the second conductive part corresponding to the second hollowed-out portion is spaced from an edge of the orthographic projection of the second hollowed-out portion on the base substrate.

9. The display substrate according to claim 7, wherein the second conductive part comprises at least one of a bonding pad, a first lead, a second lead or a function unit.

10. The display substrate according to claim 9, wherein the second conductive part comprises a plurality of groups of bonding pads, and each group of bonding pads comprises a plurality of secondary bonding pads; and
orthographic projections of at least a part of secondary bonding pads on the base substrate are respectively located in regions defined by orthographic projections of second hollowed-out portions in one-to-one correspondence with the at least part of secondary bonding pads, and a periphery of an orthographic projection of each of the secondary bonding pads is spaced from an edge of an orthographic projection of a second hollowed-out portion corresponding to the each of the secondary bonding pads.

11. The display substrate according to claim 10, wherein in the first direction, a space between two adjacent first hollowed-out portions is equal to a space between two adjacent groups of bonding pads.

12. The display substrate according to claim 10, wherein the first conductive part comprises at least two first hollowed-out portions distributed in the first direction in sequence, and a ratio of a space between the at least two first hollowed-out portions in the first direction to a space between the two adjacent groups of bonding pads is 0.8-2.

13. The display substrate according to claim 10, wherein orthographic projections of the plurality of groups of bonding pads on the base substrate are located in the region of the orthographic projection of the second hollowed-out portion on the base substrate.

14. The display substrate according to claim 9, wherein the second conductive part comprises the first lead extending in the first direction; and
an orthographic projection of at least a part of the first lead on the base substrate overlaps with the region defined by the orthographic projection of the second hollowed-out portion on the base substrate, and an edge of an orthographic projection of at least one side of the first lead is spaced from an edge of the orthographic projection of the second hollowed-out portion;
and/or
the second conductive part comprises the second lead extending in the second direction; and
an orthographic projection of at least a part of the second lead on the base substrate overlaps with the region defined by the orthographic projection of the second hollowed-out portion on the base substrate, and an edge of an orthographic projection of at least one side of the second lead is spaced from an edge of the orthographic projection of the second hollowed-out portion.

15. The display substrate according to claim 9, wherein the second conductive part comprises a plurality of function units; and
an orthographic projection of each function unit on the base substrate is located in a region defined by an orthographic projection of each second hollowed-out portion corresponding to he each functioning unit, and a periphery of the orthographic projection of each function unit is spaced from an edge of the orthographic projection of each corresponding second hollowed-out portion.

16. The display substrate according to claim 9, wherein the second conductive part comprises a plurality of groups of bonding pads and first leads which are in one-to-one correspondence with the plurality of groups of bonding pads, and a distribution direction of the plurality of groups of bonding pads, an extending direction of the first leads and an extending direction of the second hollowed-out portion are the first direction; and
orthographic projections of the first leads on the base substrate are located in a region of an orthographic projection of the second hollowed-out portion on the base substrate.

17. The display substrate according to claim 9, wherein the function unit comprises a test conductive part electrically connected to the bonding pads, the first leads or the second leads, and the test conductive part is configured to detect electrical properties of the bonding pads, the first leads or the second leads.

18. The display substrate according to claim 1, wherein:
a space between two adjacent groove structures in the second direction is in positive correlation with a size, in the second direction, of the first conductive part to which the two adjacent groove structures belong.

19. The display substrate according to claim 18, wherein a ratio of the space between the two adjacent groove structures in the second direction to the size, in the second direction, of the first conductive part to which the two adjacent groove structures belong is 8%-10%.

20. A display apparatus, comprising a display substrate, wherein the display substrate comprises;
a base substrate;
a first conductive layer, disposed on a side of the base substrate, wherein the first conductive layer comprises:
a plurality of first conductive parts extending in a first direction and having different sizes in a second direction;
a second conductive layer, disposed on a side of the first conductive layer facing away from the base substrate; and
an insulation layer, disposed between the first conductive layer and the second conductive layer; wherein
at least two first conductive parts each comprise a first hollowed-out portion, the first hollowed-out portion comprises a plurality of groove structures distributed in the second direction and extending in the first direction, and the first direction and the second direction produce angles.

* * * * *